US012588453B2

(12) United States Patent
Son

(10) Patent No.:     US 12,588,453 B2
(45) Date of Patent:     Mar. 24, 2026

(54) APPARATUS FOR TREATING SUBSTRATE AND RELATED MANUFACTURING METHOD

(71) Applicant: SEMES CO., LTD., Cheonan-si (KR)

(72) Inventor: Young Jun Son, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 18/141,290

(22) Filed: Apr. 28, 2023

(65) Prior Publication Data

US 2024/0162055 A1     May 16, 2024

(30) Foreign Application Priority Data

Nov. 14, 2022     (KR) ........................ 10-2022-0151308

(51) Int. Cl.
| | |
|---|---|
| *H01L 21/67* | (2006.01) |
| *H01L 21/02* | (2006.01) |
| *H01L 21/683* | (2006.01) |
| *H01L 21/687* | (2006.01) |

(52) U.S. Cl.
CPC .. *H01L 21/67051* (2013.01); *H01L 21/02052* (2013.01); *H01L 21/67034* (2013.01); *H01L 21/6838* (2013.01); *H01L 21/6875* (2013.01)

(58) Field of Classification Search
CPC ......... H01L 21/02052; H01L 21/02054; H01L 21/67028; H01L 21/67034; H01L 21/6704; H01L 21/67051; H01L 21/6838; H01L 21/68714; H01L 21/68735; H01L 21/68742; H01L 21/6875; H01L 21/68764
See application file for complete search history.

(56) References Cited

U.S. PATENT DOCUMENTS

| | | | | |
|---|---|---|---|---|
| 5,608,943 A | * | 3/1997 | Konishi | ............ H01L 21/67051 15/302 |
| 2009/0202951 A1 | * | 8/2009 | Yamamoto | ............... B05D 5/06 134/198 |
| 2013/0174873 A1 | * | 7/2013 | Yoshihara | ................. B08B 5/02 134/21 |
| 2013/0319457 A1 | * | 12/2013 | Lee | ................... H01L 21/67051 134/1 |
| 2015/0090302 A1 | * | 4/2015 | Fujiwara | ........... H01L 21/67051 134/99.1 |

FOREIGN PATENT DOCUMENTS

| | | | |
|---|---|---|---|
| JP | 2008-130822 B | 12/2011 |
| KR | 10-2007-0048513 A | 5/2007 |
| KR | 10-1061912 B1 | 9/2011 |
| KR | 10-2015-0121472 A | 10/2015 |

* cited by examiner

*Primary Examiner* — David G Cormier
(74) *Attorney, Agent, or Firm* — Muir Patent Law, PLLC

(57)     ABSTRACT

A substrate treating apparatus includes a housing having an inner space; a support positioned in the inner space and configured to support a substrate; a treating container having a treating space therein and surrounding the supported substrate. A cleaning unit may supply a liquid to the substrate supporting on the support and a heating unit may heat a fluid that is supplied to the treating space to decrease a relative humidity of the treating space.

15 Claims, 19 Drawing Sheets

APPARATUS FOR TREATING SUBSTRATE AND RELATED MANUFACTURING METHOD

CROSS-REFERENCE TO RELATED APPLICATIONS

A claim for priority under 35 U.S.C. § 119 is made to Korean Patent Application No. 10-2022-0151308 filed on Nov. 14, 2022, in the Korean Intellectual Property Office, the entire contents of which are hereby incorporated by reference.

TECHNICAL FIELD

Embodiments of the inventive concept described herein relate to a substrate treating apparatus and method.

BACKGROUND

Various processes such as a photolithography process, an etching process, an ashing process, a thin film deposition process, and a cleaning process are performed to manufacture a semiconductor chip or a flat plate display panel. Among these processes, the photolithography process involves sequentially or selectively performing a coating process of supplying a photoresist liquid to a semiconductor substrate to form a coating film on a substrate surface, an exposing process of exposing a coating layer using a mask, and a developing process of obtaining a desired pattern on the semiconductor substrate by supplying a developing liquid.

In an exposing apparatus for performing the exposing process, if particles are present on a bottom surface of a substrate when the substrate is mounted on a support plate, a local distortion occurs during the exposing process. Accordingly, after performing the coating process and before performing the exposing process, a cleaning process of cleaning the bottom surface of the substrate may be performed. When the bottom surface of the substrate is cleaned by supplying a cleaning liquid to the bottom of the surface, a pressure within the space at which the cleaning liquid is supplied increases. Especially, when the cleaning liquid is supplied to the bottom surface of the rotating substrate, a pressure within a space below the substrate increases rapidly due to a rotation. In this case, a large amount of mist is generated by the raised pressure, and a large amount of mist sticks to an inner wall of a treating container surrounding the substrate. The mist on the inner wall of the treating container may act as a contaminant to a substrate subsequently introduced into the treating container.

SUMMARY

Embodiments of the inventive concept provide a substrate treating apparatus and method for efficiently cleaning a substrate.

Embodiments of the inventive concept provide a substrate treating apparatus and method for uniformly cleaning a bottom surface of a substrate.

Embodiments of the inventive concept provide a substrate treating apparatus and method for minimizing the generation of foreign substances during a treating process.

The technical objectives of the inventive concept are not limited to the above-mentioned ones, and other unmentioned technical objects will become apparent to those skilled in the art from the following description.

The inventive concept provides a substrate treating apparatus. In some examples, the substrate treating apparatus includes a housing having an inner space; a support disposed in the inner space and configured to support a substrate; a treating container having a treating space therein and surrounding a substrate supported on the support; a cleaning unit configured to supply a liquid to the substrate supported on the support; and a heating unit configured to heat a fluid supplied to the treating space to adjust a relative humidity of the treating space.

In an embodiment, the support may be configured to support a first region of the substrate and rotate the substrate, and the substrate treating apparatus may further comprise a fluid supply unit configured to supply the fluid including a body having a groove formed at a top surface and surrounding the first support and a main pipe connected to the groove to supply the fluid.

In an embodiment, the fluid supply unit further includes a bypass pipe for bypassing the main pipe, and the heating unit includes a heater, and the heater is installed at the bypass pipe and heats the fluid which flows through the bypass pipe.

In an embodiment, the heating unit includes a heating wire or other resistive heating element inserted into the groove to heat the fluid which passes through the groove.

In an embodiment, a second support may be used to support a second region of the substrate, the second region being different from the first region. The first support may include a spin chuck which vacuum sucks the first region, and the second support may include a bracket which moves along a guide rail installed on a sidewall of the housing and a side chuck which is connected to the bracket and which vacuum adsorbs the second region.

In an embodiment, the cleaning unit supplies the liquid to a non-patterned surface of the substrate.

In an embodiment, a first cleaning unit is configured to supply a liquid to the first region of a substrate supported on the second support, and a second cleaning unit is configured to supply a liquid to the second region of a substrate supported on the first support.

In an embodiment, the second cleaning unit supplies the liquid toward a bottom surface of the substrate while the first support rotates the substrate.

In an embodiment, the first cleaning unit supplies the liquid to the bottom surface of the substrate while the substrate is horizontally moved by the bracket.

In an embodiment, the first cleaning unit includes a first nozzle positioned at an outer side of the spin chuck and discharging the liquid to the bottom surface of the substrate. The first nozzle projects upwardly and is inclined in a direction toward the second region.

In an embodiment, the cleaning unit includes a nozzle which discharges the liquid to the bottom surface of the substrate, and wherein the heating unit supplies the fluid which is heated to the liquid which is flowing within the nozzle.

In an embodiment, the cleaning unit includes a nozzle which discharges the liquid to the bottom surface of the substrate. The nozzle may include a plurality of outlets, and a first one of the plurality of outlets discharges the liquid, and a second one of the plurality of outlets supplies the fluid, and the heating unit heats the fluid which is supplied to the second outlet.

In an embodiment, the heating unit heats the fluid to a temperature of 23° C. or higher.

In an embodiment, the liquid includes at least one of a deionized water, water diffused with ozone, water diffused with hydrogen, and/or water diffused with ammonia water, and the fluid is a gas, such as air.

The inventive concept provides a substrate treating method. The substrate treating method includes cleaning a center region of a substrate by exposing the center region to a treating space and supplying a liquid to the center region while supporting an edge region of the substrate; drying the center region after the cleaning of the center region; cleaning the edge region by exposing the edge region to the treating space while supporting the center region; and drying the edge region after the cleaning the edge region, and wherein at least one of the cleaning of the center region, the drying of the center region, the cleaning of the edge region, and the drying of the edge region, a heated fluid is supplied to the treating space to adjust a relative humidity of the treating space.

In an embodiment, the cleaning the center region further includes horizontally moving the substrate back and forth while supporting the edge region of the substrate by a side chuck, and supplying the liquid to the center region by a center cleaning unit while the side chuck is horizontally moving the substrate back and forth. The cleaning of the edge region may include rotating the substrate while supporting the center region of the substrate by a spin chuck and supplying the liquid to the edge region by an edge cleaning unit while the spin chuck rotates the substrate.

In an embodiment, the drying of the center region may include drying the center region by supplying a fluid to the center region while the side chuck is horizontally moving the substrate back and forth while supporting the edge region of the substrate, and the drying of the edge region may include drying the edge region while the spin chuck is rotating the substrate while supporting the center region of the substrate.

In an embodiment, the cleaning of the center region and the cleaning of the edge region each may include supplying a fluid radially outwardly to a non-patterned surface of the substrate.

In an embodiment, the heated fluid is further supplied during the drying of the center region, and a temperature of the heated fluid is 23° C. or higher.

In some examples, a substrate treating apparatus includes a housing having an inner space, a first support configured to support a center region of the substrate and rotate thereof, a second support configured to support an edge region of the substrate, a treating container having a treating space surrounding a substrate when the substrate is supported on the first support or the second support, a first cleaning unit configured to supply a liquid to the center region of the substrate, a second cleaning unit positioned between the first support and the treating container and configured to supply a fluid to the treating space, and a heating unit configured to heat the fluid as supplied to the treating space to reduce a relative humidity of the treating space.

According to an embodiment of the inventive concept, a substrate may be efficiently cleaned.

According to an embodiment of the inventive concept, a bottom surface of a substrate may be uniformly cleaned.

According to an embodiment of the inventive concept, foreign substances may be efficiently removed and contamination by cleaning by-products may be avoided/reduced during a treating process.

The effects of the inventive concept are not limited to the above-mentioned ones, and the other unmentioned effects will become apparent to those skilled in the art from the following description.

4

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 2 is a cross-sectional view schematically showing a coating block or a developing block of FIG. 1.

DETAILED DESCRIPTION

Figure 1:
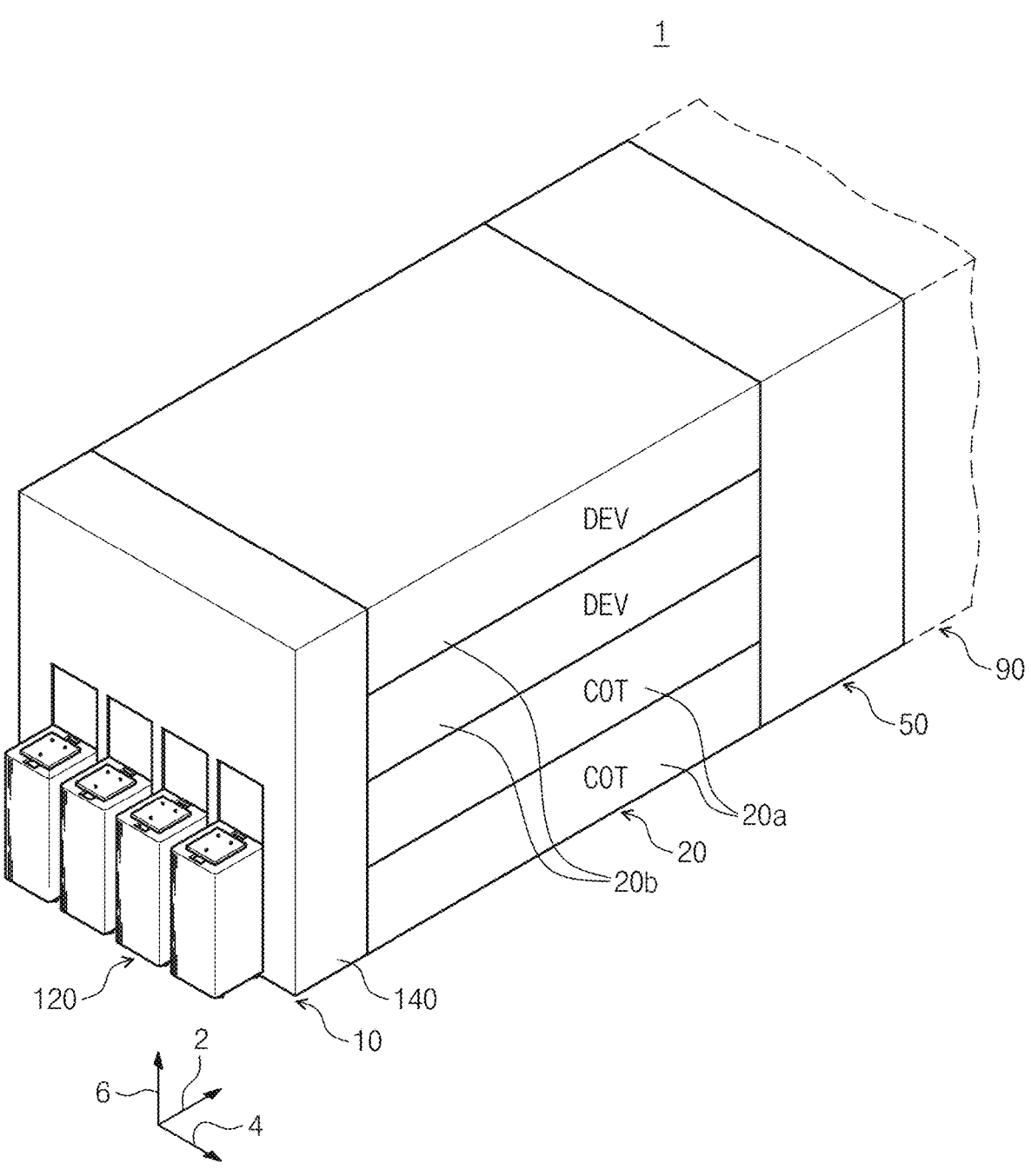
FIG. 1 is a perspective view schematically illustrating a substrate treating apparatus according to an embodiment.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies may not be described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present (i.e., they may be in contact with one another). Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the ordinal numbers first, second, third, etc. may be used herein to identify various elements, components, regions, layers and/or sections, these elements, components, regions, layers and/or sections should not be limited by these ordinal numbers. These ordinal numbers may be used to distinguish one element, component, region, layer or section from another region, layer or section. Ordinal numbers such as "first," "second," and other numerical terms when used herein do not imply a sequence or order unless clearly indicated by the context. Thus, a "first" element, component, region, layer or section discussed below could be referenced elsewhere (e.g., claimed) as a "second" element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range.

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that variances for the shape (e.g., resulting from conventional to manufacturing processes) is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings.

In the following exemplary substrate treating apparatus and method, a substrate to be treated is a circular substrate such as a semiconductor wafer as an example. However, the inventive concept is not limited thereto, and the exemplary substrate treating apparatus and method may be applied to a rectangular substrate such as a mask or a display panel. It will be understood that the substrate may be the starting base substrate (e.g., a bulk silicon substrate, a silicon-on-insulator (SOI) substrate, etc.) or may comprise a base substrate with additional layers formed thereon (e.g., the substrate may be an intermediate product of a semiconductor manufacturing process).

In an embodiment of the inventive concept, a substrate treating apparatus may perform at least one of a coating process for forming a coating film on a surface of a substrate by supplying a photosensitive liquid such as a photoresist liquid on the substrate, an exposure process for exposing the coating film, and a developing process for forming a desired pattern on the substrate by supplying a developing liquid on the substrate. However, the inventive concept is not limited hereto, and additionally and/or alternatively, the substrate treating apparatus according to an embodiment may perform various other processes.

Figure 2:
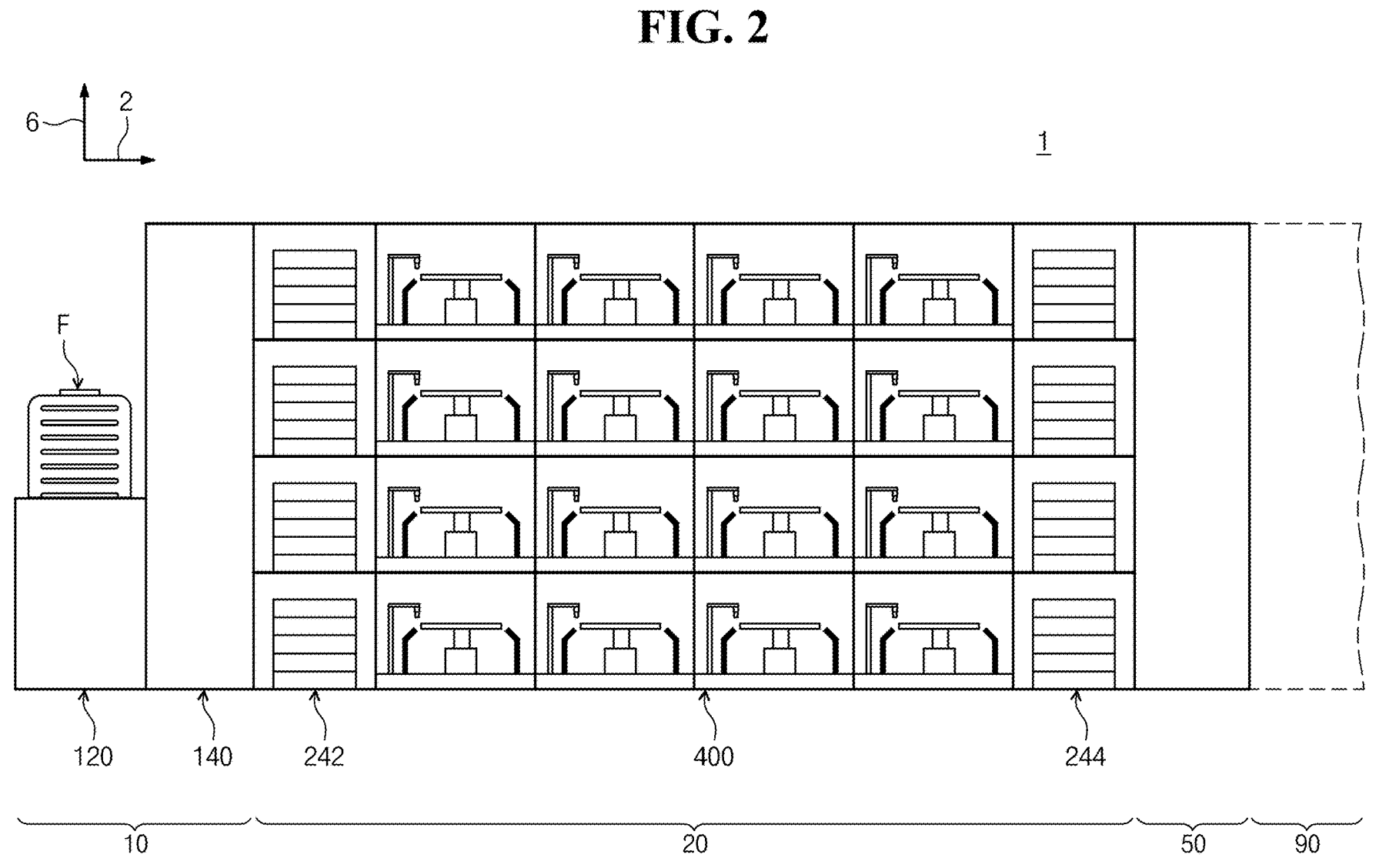
Figure 3:
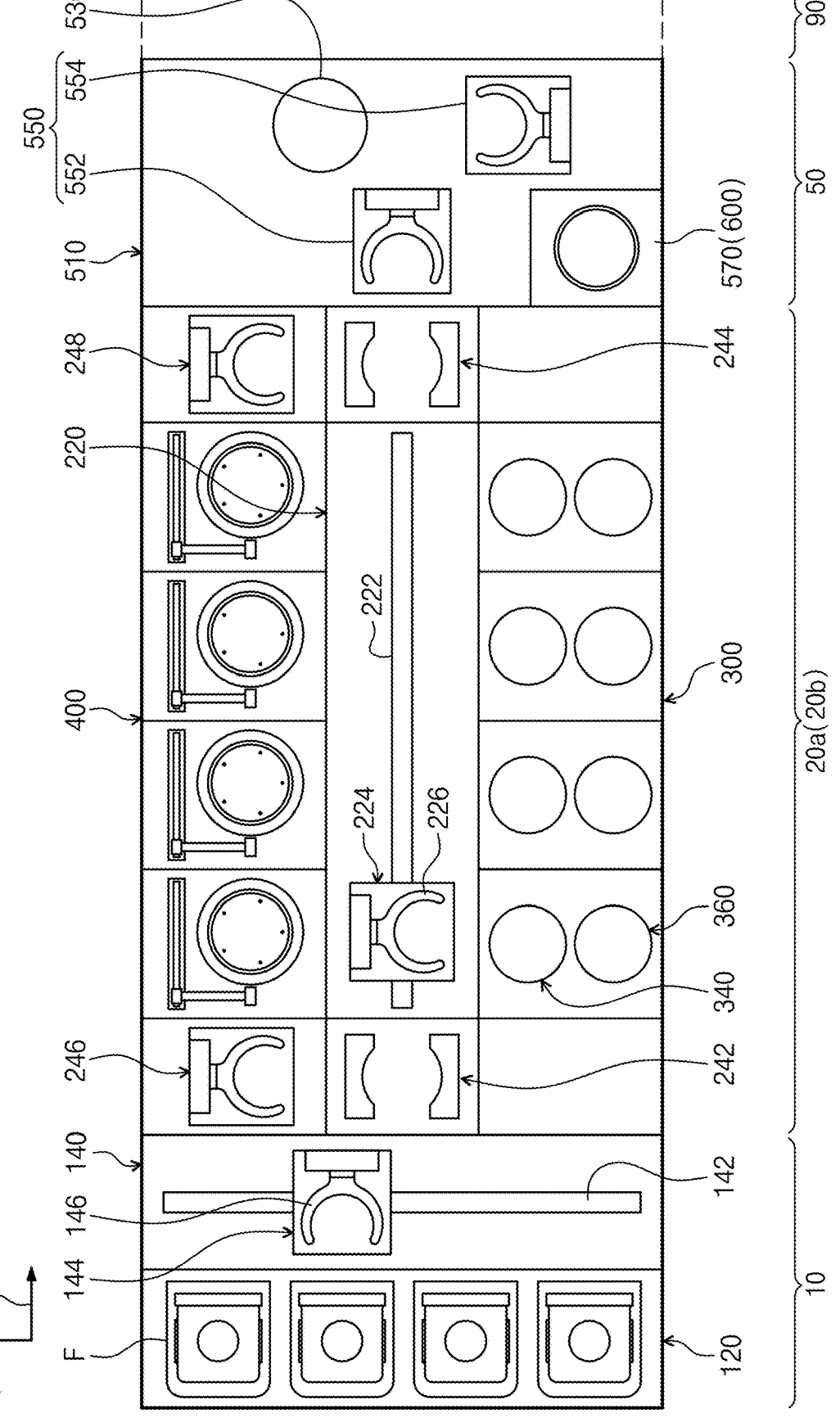
FIG. 3 is a top plan view schematically showing the substrate treating apparatus of FIG. 1.

FIG. 1 is a perspective view schematically illustrating a substrate treating apparatus according to an embodiment. FIG. 2 is a cross-sectional view schematically showing the coating block or developing block of FIG. 1. FIG. 3 is a plan view schematically showing the substrate treating apparatus of FIG. 1.

The substrate treating apparatus 1 may include an index module 10, a treating module 20, and an interface module 50.

The index module 10, the treating module 20, and the interface module 50 are arrange sequentially along a preset direction. Hereinafter, a direction in which the index module 10, the treating module 20, and the interface module 50 are disposed will be referred to as a first direction 2. Also, when viewed from above, a direction perpendicular to the first direction 2 will be referred to as a second direction 4, and a direction perpendicular to a plane including both the first direction 2 and the second direction 4 will be referred to as a third direction 6. For example, the third direction 6 may be a direction perpendicular to the ground.

The index module 10 transfers the substrate between a container F and the treating module 20. More specifically, the index module 10 takes out and delivers the substrate from the container F toto the treating module 20 for treating the substrate. The index module 10 takes out the substrate to which a predetermined treatment has been completed in the treating module 20 from the treating module 20 and delivers the substrate to the container F. The index module 10 has a load port 120 and an index frame 140.

The container F containing substrate(s) is accommodated in the load port 120. The load port 120 is disposed on an opposite side of the treating module 20 based on the index frame 140 to be described later. A plurality of load ports 120 may be provided, and the plurality of load ports 120 are arranged in a line along the second direction 4. The number of load ports 120 may increase or decrease according to design needs, such as process efficiency or footprint conditions of the treating module 20.

a plurality of substrates are stored in the container F. In an embodiment, the container F which is stored in the load port 120 may be a sealing container such as a front opening unified pod (FOUP). The container F may be delivered into the load port 120 by a transfer means such as an overhead transfer, an overhead conveyor, and an automatic guided vehicle or by an operator.

The index frame 140 has a lengthwise direction parallel to the second direction 4. An index rail 142 and an index robot 144 are disposed inside the index frame 140. The index rail 142 has a lengthwise direction parallel to the lengthwise direction of the index frame 140. The index robot 144 transfers the substrate. More specifically, the index robot 144 may transfer the substrate between the container F stored in the load port 120 and a front buffer 242 to be described later. The index robot 144 forwardly and backwardly moves on the index rail 142 along the lengthwise direction of the index rail 142.

The index robot 144 has an index hand 146. When transferring a substrate, the substrate is placed on the index hand 146. The index hand 146 moves forwardly and backwardly, rotates about the third direction 6 as a rotational axis, and moves up and down along the third direction 6.

The treating module 20 may perform a coating process and/or a developing process on the substrate. According to an embodiment, the treating module 20 may include a coating block 20*a* and a developing block 20*b*. The coating block 20*a* performs the coating process on the substrate. The developing block 20*b* performs a developing process on the substrate.

A plurality of coating blocks 20*a* and a plurality of developing blocks 20*b* may be provided, and the plurality of coating blocks 20*a* and the plurality of developing blocks 20*b* may be stacked on each other, respectively. According to an embodiment, the stacked coating blocks 20*a* may be disposed below the stacked developing blocks 20*b*. In addition, each of the coating blocks 20*a* may have the same or similar structure, and may perform the same or similar process. In addition, each of the developing blocks 20*b* may have the same or similar structure, and may perform the same or similar process. However, the inventive concept is not limited thereto, and each coating block 20*a* may perform different processes, and each developing block 20*b* may perform different processes. In addition, the number and arrangement of the coating blocks 20*a* and the number and arrangement of the developing blocks 20*b* may be variously changed.

The coating block 20*a* and the developing block 20*b* according to an embodiment may be configured to have the same or similar structure and arrangement with each other. As such, a detailed description of the developing block 20*b* will be omitted hereinafter, and the coating block 20*a* will be mainly described to avoid repeated explanations. However, the structural and operational details of the coating block 20*a* described herein should be understood to also be applicable to the developing block 20*b*.

Each coating block 20*a* has a transfer chamber 220, buffer chambers 242 and 244, a heat treating chamber 300, and a liquid treating chamber 400.

The transfer chamber 220 has its lengthwise direction parallel to the first direction 2. A guide rail 222 having its lengthwise direction parallel to the first direction 2 and a transfer robot 224 are disposed in the transfer chamber 220. The transfer robot 224 transfers the substrate between the buffer chambers 242 and 244, the heat treating chamber 300, and the liquid treating chamber 400. The transfer robot 224 moves forwardly and backwardly along the lengthwise direction of the guide rail 222 on the guide rail 222. The transfer robot 224 has a transfer hand 226 on which the substrate is placed during transfer. The structure of the transfer hand 226 may have the same or similar structure as that of the index hand 146 described above, and a redundant description thereof will be omitted.

The buffer chambers 242 and 244 provide a space at which substrate to be delivered into the coating block 20*a* and a substrate taken out from the coating block 20*a* temporarily remain. A plurality of buffer chambers 242 and 244 may be provided. Some of the buffer chambers are disposed between the index frame 140 and the transfer chamber 220. These buffer chambers may be referred to herein as front buffers 242. In addition, some other of the buffer chambers are disposed between the transfer chamber 220 and the interface module 50 to be described later. These buffer chambers may be referred to herein as rear buffers 244. A plurality of front buffers 242 may be provided, and the plurality of front buffers 242 may be stacked in a vertical direction. In addition, a plurality of rear buffers 244 may be provided, and the plurality of rear buffers 244 may be stacked in a vertical direction.

Each of the front buffer 242 and each of the rear buffer 244 temporarily store a plurality of substrates. A substrate stored in the front buffer 242 is taken in or taken out by the index robot 144 and the transfer robot 224. In addition, a substrate stored in the rear buffer 244 is taken in or taken out by the transfer robot 224 and the first robot 552 to be described later.

The buffer robots 246 and 248 may be disposed on a side of the buffer chambers 242 and 244. According to an embodiment, a front buffer robot 246 may be disposed on a side of the front buffer 242, and a rear buffer robot 248 may be disposed on a side of the rear buffer 244. However, the inventive concept is not limited thereto, and buffer robots may be disposed on both sides of the front buffer 242 and the rear buffer 244, respectively.

The front buffer robot 246 transfers the substrate between the front buffers 242. More specifically, the front buffer robot 246 transfers the substrate between the front buffers 242 stacked on each other while moving along the third direction 6. In addition, the rear buffer robot 248 transfers the substrate between the rear buffers 244 stacked on each other while moving along the third direction 6.

The heat treating chamber 300 performs a heat treatment process to adjust a temperature of the substrate. The heat treatment process according to an embodiment may include a cooling process of lowering a temperature of the substrate (e.g., removing heat from the substrate) and a heating process of increasing the temperature of the substrate (e.g., adding heat to the substrate). A plurality of heat treating chambers 300 may be provided. The heat treating chambers 300 are disposed along the first direction 2. In addition, the heat treating chambers 300 are arranged to be stacked in the third direction 6. The heat treating chambers 300 are positioned on one side of the transfer chamber 220.

The liquid treating chamber 400 performs a liquid treatment process of supplying a liquid on the substrate. A plurality of liquid treating chambers 400 may be provided. The liquid treating chambers 400 are disposed along the first direction 2. In addition, the liquid treating chambers 400 are arranged to be stacked in the third direction 6. The liquid treating chambers 400 are positioned on the other side of the transfer chamber 200, opposite the heat treating chambers 300. That is, the heat treating chamber 300 and the liquid treating chamber 400 are disposed on opposite sides of the transfer chamber 220.

In addition, some of the plurality of liquid treating chambers 400 are disposed adjacent to the index module 10. A liquid treating chamber 400 disposed adjacent to the index module 10 may supply a first liquid onto the substrate. In addition, some other of the plurality of liquid treating chambers 400 are disposed adjacent to the interface module 50. A liquid treating chamber 400 disposed adjacent to the interface module 50 may supply a second liquid onto the substrate. According to an embodiment, the first liquid may be an anti-reflection layer, and the second liquid may be a photoresist liquid. However, the inventive concept is not limited thereto, and the first liquid may be a photoresist liquid, and the second liquid may be an anti-reflection film. The anti-reflection layer may be supplied on the substrate to which the photoresist liquid has been supplied. Selectively, both the first liquid and the second liquid may be the same type of liquid. In this case, the first liquid and the second liquid may be a photoresist liquid having different concentrations of their components.

Figure 4:
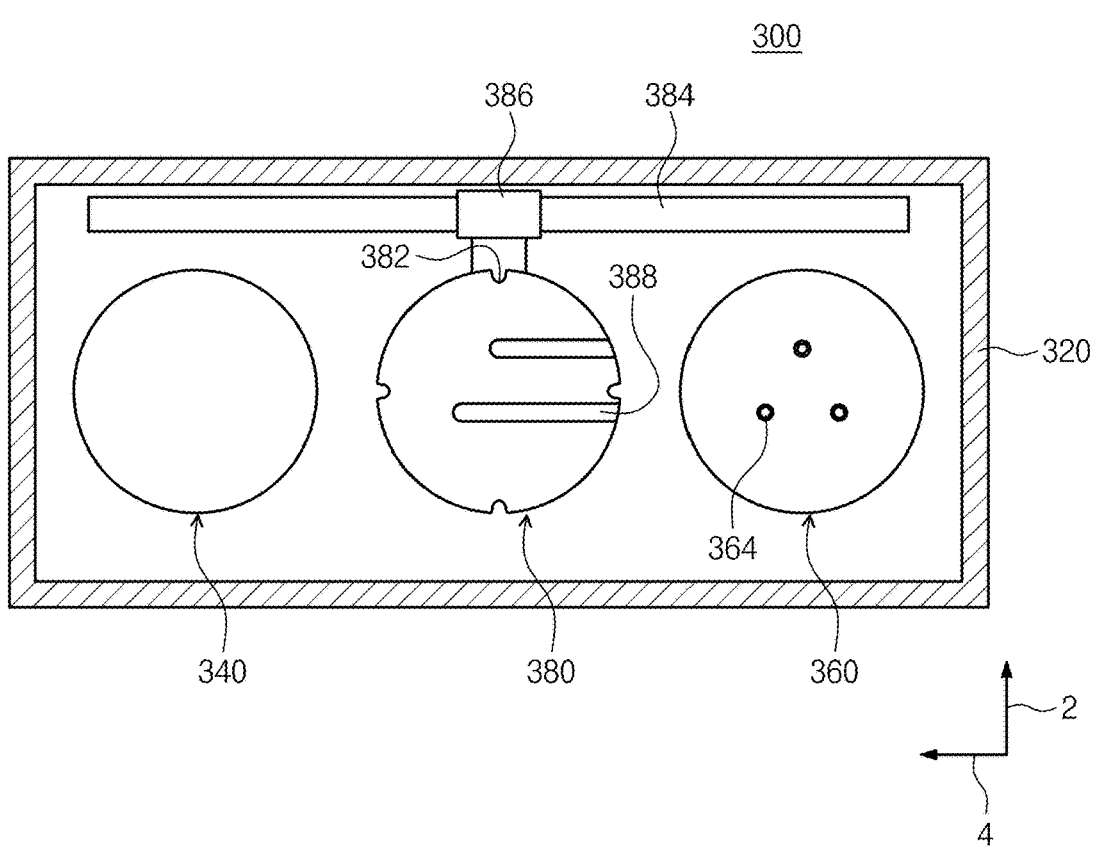
FIG. 4 is a top plan view schematically illustrating a heat treating chamber according to an embodiment.
Figure 5:
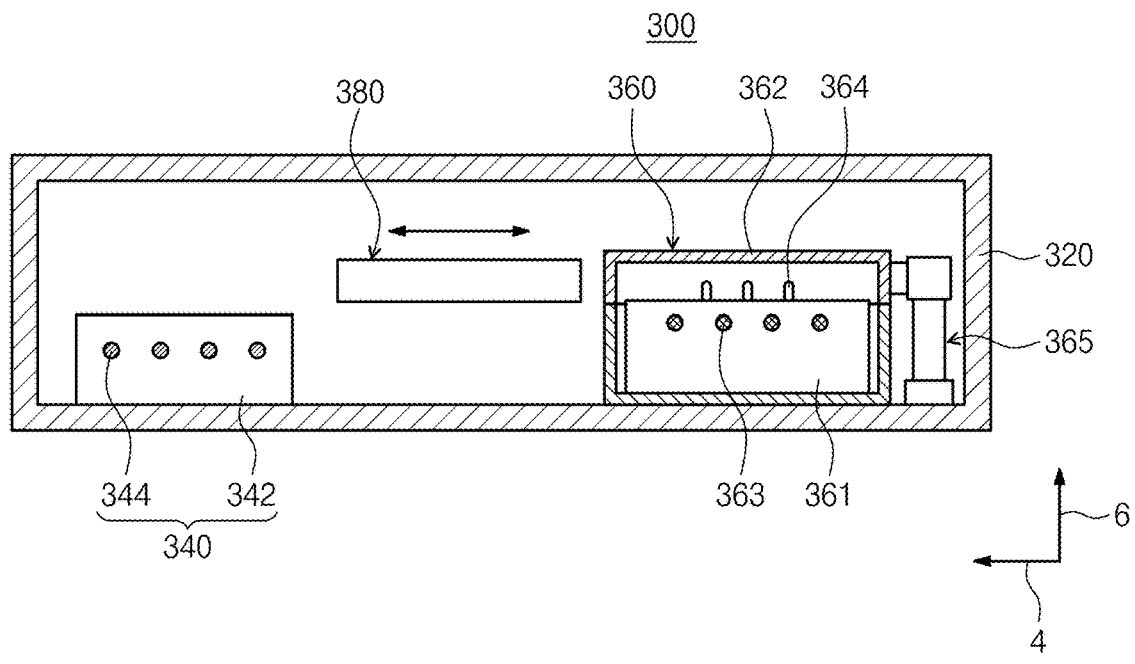
FIG. 5 is a front view schematically illustrating a heat treating chamber according to an embodiment.

FIG. 4 is a top plan view schematically illustrating a heat treating chamber according to an embodiment. FIG. 5 is a front view schematically illustrating a heat treating chamber according to an embodiment.

The heat treating chamber 300 includes a housing 320, a cooling unit 340, a heating unit 360, and a transfer plate 380.

The housing 320 has a rectangular parallelepiped shape having a space therein. An entrance (not shown) through which the substrate enters and exits is provided on the sidewall of the housing 320. The cooling unit 340, the heating unit 360, and the transfer plate 380 are positioned in an inner space of the housing 320. The cooling unit 340 and the heating unit 360 are positioned side by side in the second direction 4.

According to an embodiment, the cooling unit 340 may be positioned closer to the transfer chamber 220 than the heating unit 360 is. The cooling unit 340 includes a cooling plate 342 and a cooling fluid channel 344. The cooling plate 342 may have a substantially circular shape when viewed from above. The cooling fluid channel 344 is positioned inside the cooling plate 342. A cooling fluid may flow through the cooling fluid channel 344. As the cooling fluid flows through the cooling fluid channel 344, a temperature of the cooling plate 342 may be lowered, thereby lowering a temperature of the sub state supported thereon.

The heating unit 360 may include a heating plate 361, a cover 362, and a heater 363.

The heating plate 361 may have a circular shape when viewed from above. The heating plate 361 may have a diameter larger than that of the substrate. The heater 363 is disposed inside the heating plate 361. The heater 363 may be any one of known heating element which generate a heat by resisting a current.

A plurality of pins 364 moving up and down along the third direction 6 are disposed on the heating plate 361. The pins 364 may receive the substrate from a transfer means (e.g., transfer plate 380) outside the heating unit 360, and delivers the substrate to the heating plate 361. In addition, the pins 364 may lift the substrate from the heating plate 361 and delivers the substrate to the transfer means outside the heating unit 360.

The cover 362 has a shape in which a bottom portion is opened. The cover 362 is positioned above the heating plate 361 and can be moved in the vertical direction by the driver 365 coupled to the cover 362. The driver 365 may be any one of known motors which generates and delivers a driving force. If the cover 362 is downwardly moved by the driver 365, a closed space may be defined by the cover 362 and the heating plate 361. The space defined by the cover 362 and the heating plate 361 may function as a heating space for heating the substrate.

The transfer plate 380 generally has a disk shape. In addition, the transfer plate 380 may have a diameter corresponding to the substrate. A notch 382 is formed at an edge of the transfer plate 380. In addition, a plate driver 386 may be coupled to the transfer plate 380. The plate driver 386 is mounted on a rail 384 having a lengthwise direction parallel to the second direction 4. Accordingly, the transfer plate 380 may be linearly moved along the rail 384 by the plate driver 386.

In addition, a plurality of slit-shaped guide grooves 388 are formed in the transfer plate 380. The guide grooves 388 extend from an edge of the transfer plate 380 to an inside of the transfer plate 380. The guide groove 388 has a lengthwise direction parallel to the second direction 4, and the plurality of guide grooves 388 are formed to be spaced apart along the first direction 2. The guide grooves 388 prevents the transfer plate 380 and the pins 364 from interfering with each other when the substrate W is transferred between the transfer plate 380 and the heating unit 360.

For example, for transferring the substrate W to the heating unit 360, the transfer plate 380 supporting the substate W moves laterally toward and over the heating unit 360 such that the pins 364 may insert into respective guide groove 388 to support the substrate W, and then the transfer plate 380 moves away (e.g., laterally moves) from the heating unit 360, thereby the substrate W sits on the pins 364. The pin 364 supporting substrate W thereon moves down to place the substrate W on the heating plate 361. A temperature of the substrate mounted on the heating plate 361 may be increased by heat generated by the heater 363. In addition, the transfer plate 380 may be in contact with the cooling plate 342. More specifically, the transfer plate 380 supporting the substrate W thereon may move over the cooling plate 324 and contact the cooling plate 342. The temperature of the substrate mounted on the transfer plate 380 may be lowered by heat transfer through the transfer plate 380 to a cooling fluid flowing through the cooling fluid channel 344 of the cooling plate 342.

In addition, according to an embodiment, the heating unit 360 provided in some of the plurality of heat treating chambers 300 may improve an adhesion rate of the photoresist liquid to the substrate by supplying a gas while heating the substrate. According to an embodiment, the gas may be a hexamethyldisilane.

Figure 6:
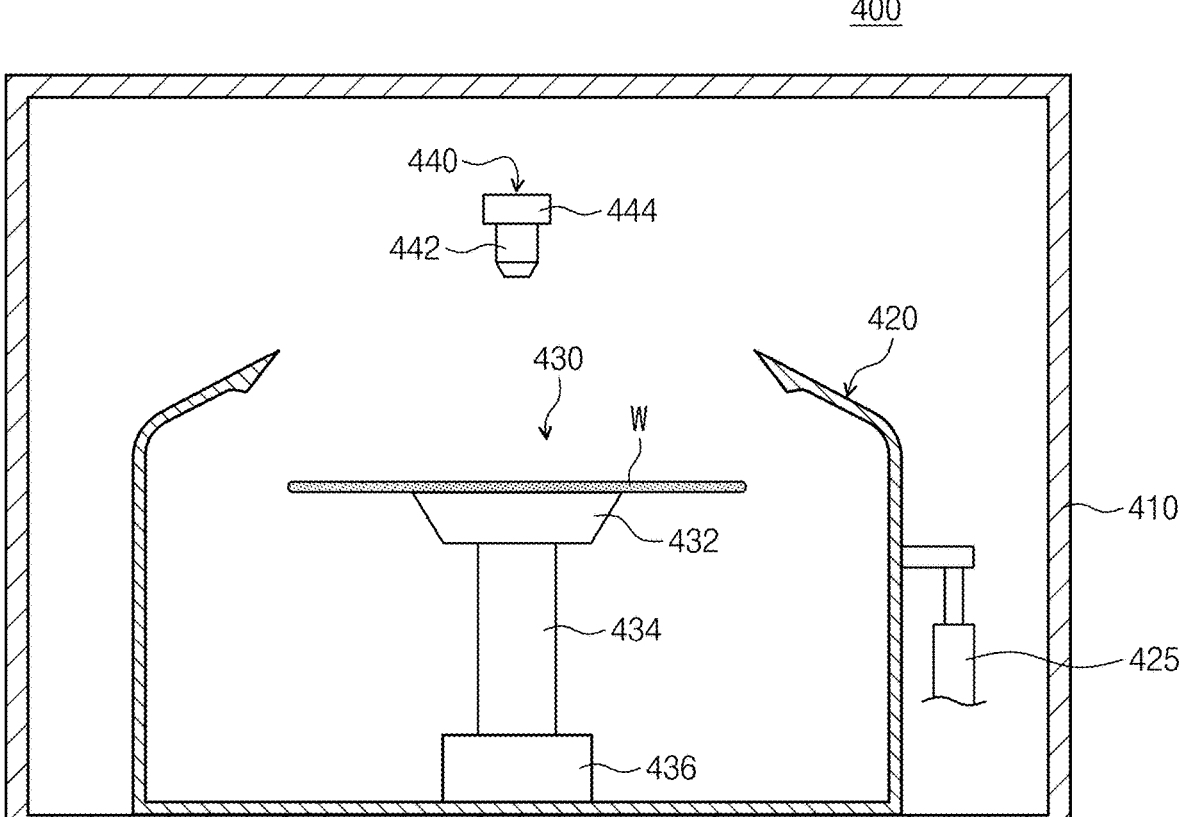
FIG. 6 is a cross-sectional view schematically illustrating a liquid treating chamber according to an embodiment.

FIG. 6 is a cross-sectional view schematically illustrating a liquid treating chamber according to an embodiment.

The liquid treating chamber 400 may include a housing 410, a cup body 420, a support 430, and a liquid supply unit 440.

The housing 410 may have a substantially hexahedral shape. The housing 410 has a space therein. The cup body 420 and the support 430 are positioned inside the housing 410. An inlet (not shown) through which the substrate W is taken in and out is formed on a sidewall of the housing 410.

The cup body 420 has a cup shape with an open top part. The cup body 420 may surround the support 430 to be described later. More specifically, the cup body 420 may surround the support 430 and the substrate W supported by the support 430. The cup body 420 may generally have a ring shape. The cup body 420 may be coupled to a cup driver 425. The cup driver 425 lifts and lowers the cup body 420. The cup driver 425 according to an embodiment may be a motor. According to an embodiment, while treating the substrate W, the cup driver 425 may upwardly move the cup body 420. Accordingly, while treating the substrate W, a top end of the cup body 420 may be positioned higher than a top surface of the substrate W supported by the support 430. On the contrary, after the treating the substrate W is completed, the cup driver 425 may downwardly move the cup body 420 so that the top end of the cup body 420 is positioned lower than a top end of the substrate W supported by the support 430.

The support 430 supports and rotates the substrate W. The support 430 may include a support plate 432, a support shaft 434, and a support driver 436.

The substrate W is mounted on a top surface of the support plate 432. The top surface of the support plate 432 has a substantially circular shape when viewed from above. The top surface of the support plate 432 has a diameter smaller than that of the substrate W. The support shaft 434 is coupled to a lower end of the support plate 432. The support shaft 434 has a lengthwise direction parallel to the third direction 6. The support shaft 434 is coupled to the support driver 436. The support shaft 434 may rotate by receiving a power from the support driver 436.

The liquid supply unit 440 supplies a liquid to the substrate W supported by the support 430. The liquid according to an embodiment may include a coating liquid. For example, the coating liquid may be at least one of a photosensitive liquid such as a photoresist liquid (PR), a liquid forming an anti-reflection film on the substrate W, and/or a prewet liquid which changes a surface property of the substrate W so that the surface of the substrate W has a hydrophobic property.

The liquid supply unit 440 may include a nozzle 442 and a nozzle arm 444. The nozzle 442 supplies a liquid to the substrate W. Although FIG. 6 shows that there is one nozzle 442, the inventive concept is not limited thereto. For example, at least N nozzles 442 (N is a natural number of 2 or more) may be provided. Each of the nozzles 442 may supply different liquids to the substrate W. In addition, some of the nozzles 442 may supply the same liquid to the substrate W, but may supply a liquid having different concentration of its components to the substrate W.

The nozzle arm 444 supports the nozzle 442. The nozzle 442 is installed at an end of the nozzle arm 444. The nozzle arm 444 may be coupled to a driver (not shown) and its position may be changed. Accordingly, positions of the nozzles 442 may also be changed so that positions of liquid(s) supplied to the substrate W may be changed.

Referring back to FIG. 1 to FIG. 3, the interface module 50 connects the treating module 20 to an external exposure apparatus 90. The interface module 50 includes an interface frame 510, an interface buffer 530, a transfer unit 550, and an additional process chamber 570.

The interface frame 510 may be a housing that provides an enclosed space in which the interface buffer 530, the transfer unit 550, and the additional process chamber 570 are positioned inside. The interface buffer 530 provides a space in which the substrate is temporarily stored in a process of transferring the substrate between the coating block 20a, the additional process chamber 570, the exposure apparatus 90, and the developing block 20b. A plurality of interface buffers 530 may be provided, and the plurality of interface buffers 530 may be stacked on each other.

The transfer unit 550 transfers the substrate between the coating block 20a, the additional process chamber 570, the exposure apparatus 90 or the developing block 20b. The transfer unit 550 includes at least one robot. According to an embodiment, the transfer unit 550 may include a first robot 552, a second robot 554, and a third robot (not shown).

The first robot 552 may transfer the substrate between the coating block 20a, the additional process chamber 570, and the exposure apparatus 90. More specifically, the first robot 552 may transfer the substrate from the rear buffer 244 to the additional process chamber 570, and then (after processing by the additional process chamber 57) from the additional process chamber 570 to the interface buffer 530. In addition, the second robot 554 may transfer the substrate from the interface buffer 530 to the exposure apparatus 90 for exposing the substrate, and from the exposure apparatus 90 (after its exposure) to the interface buffer 530. The third robot, which is not shown, may transfer the substrate (after its exposure) from the interface buffer 530 to the developing block 20b. Each of the first robot 552, the second robot 554, and the third robot (not shown) may include a hand on which a substrate is placed. Each hand may move forward and backward, rotate around an axis parallel to the third direction 6, and vertically move along the third direction 6.

The additional process chamber 570 may perform a predetermined additional process on the substrate after the substrate has been subject to a predetermined process (e.g., a coating process) at the coating block 20a and before the substrate is taken into the exposure apparatus 90 (where it is subject to an exposure process). In addition, the additional process chamber 570 may perform a predetermined additional process on the substrate that has been treated by the exposure apparatus 90 before the substrate is taken into the developing block 20b.

A plurality of additional process chambers 570 may be provided. In addition, the plurality of additional process chambers 570 may be stacked on each other. All of the process chambers 570 may perform the same process. In some examples, the process chambers 570 may perform different processes. For example, one or more of the plurality of process chambers 570 may perform an edge exposure process of exposing an edge region of the substrate. In addition, one or more of the other of the plurality of process chambers 570 may perform a top surface cleaning process of cleaning a top surface of the substrate. In addition, one or more of the plurality of process chambers 570 may perform a bottom surface cleaning process of cleaning a bottom surface of the substrate.

Hereinafter, it will be described as an example that the additional process chamber 570 according to an embodiment is a bottom surface cleaning chamber 600 for cleaning the bottom surface of the substrate.

Figure 7:
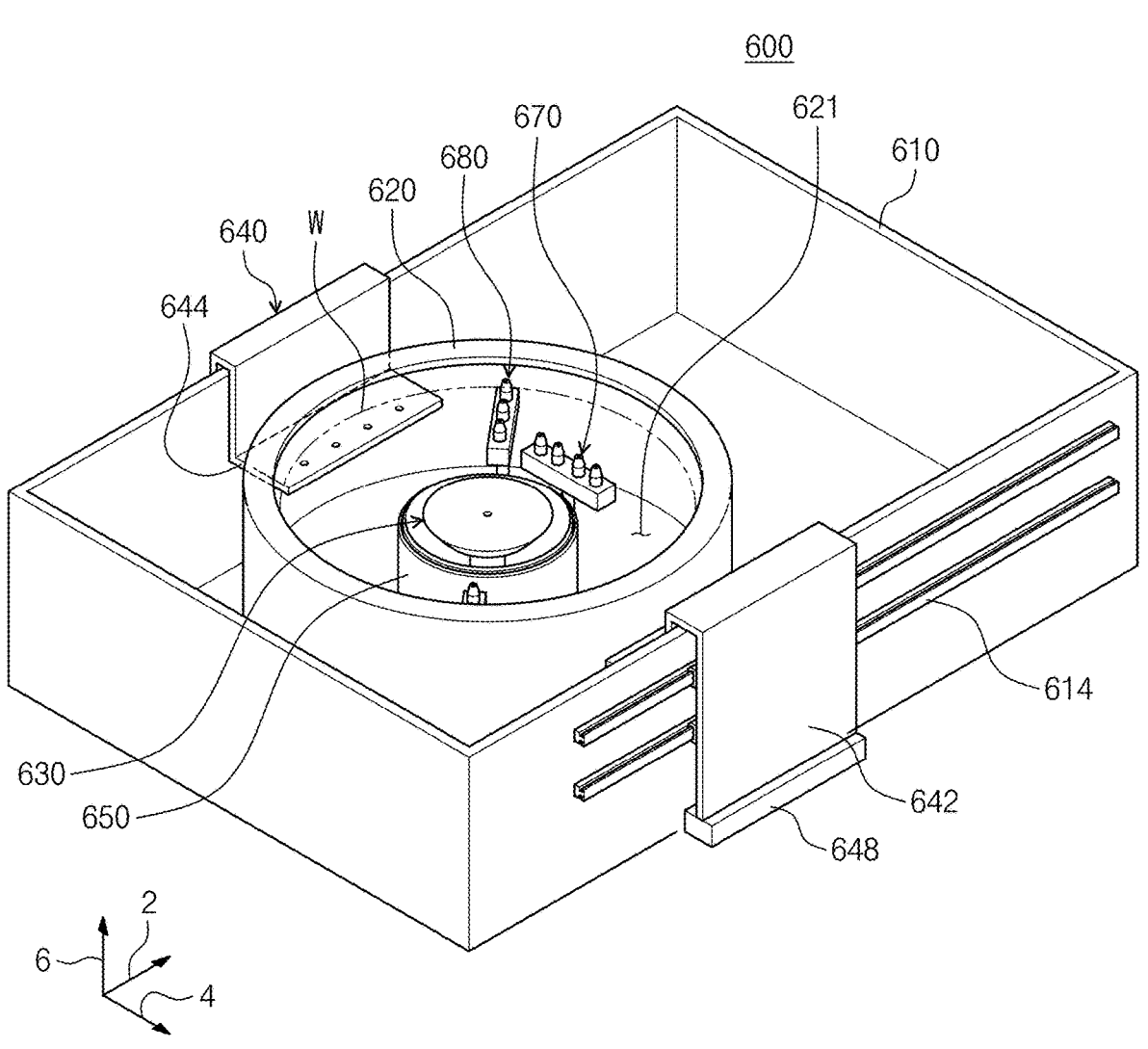
FIG. 7 is a perspective view schematically illustrating a bottom surface cleaning chamber according to an embodiment.
Figure 8:
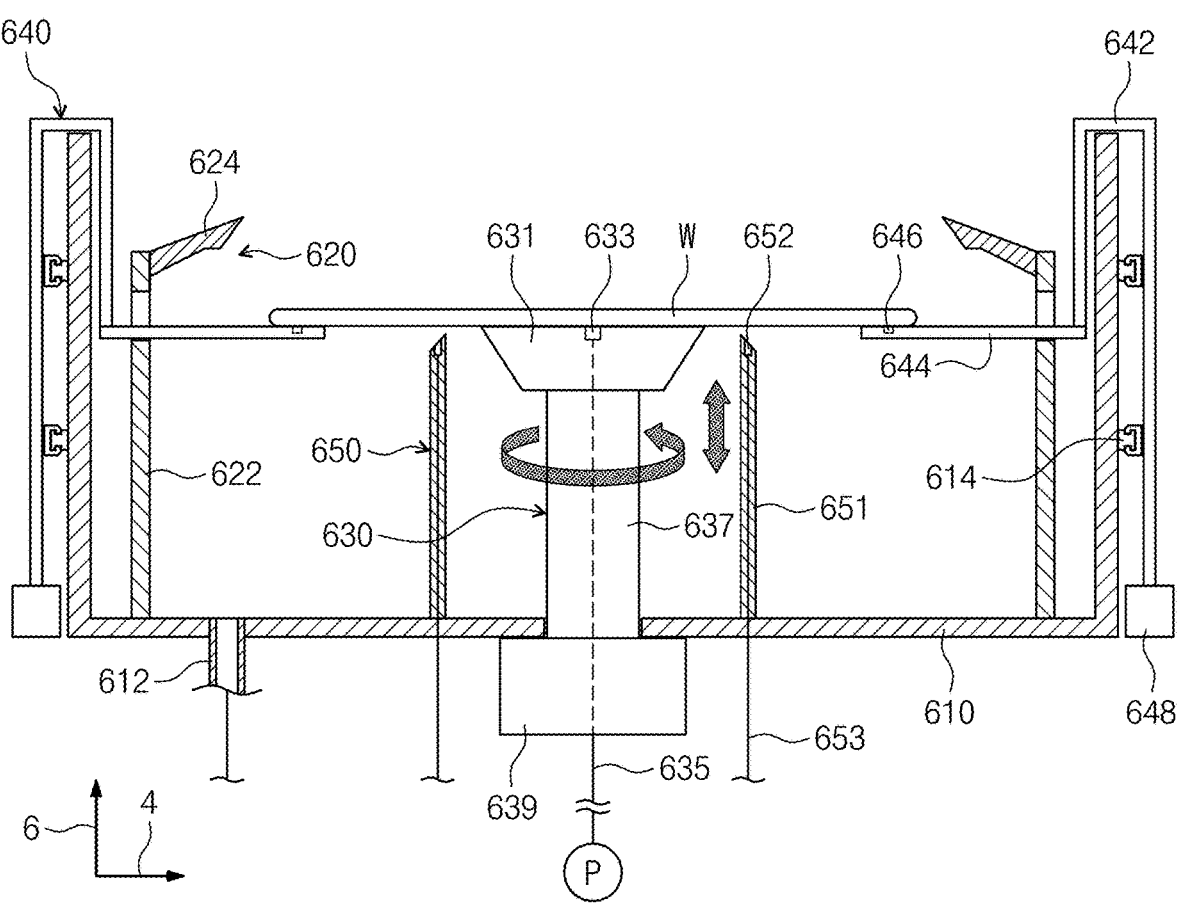
FIG. 8 is a cross-sectional view schematically showing a bottom surface cleaning chamber according to an embodiment.
Figure 9:
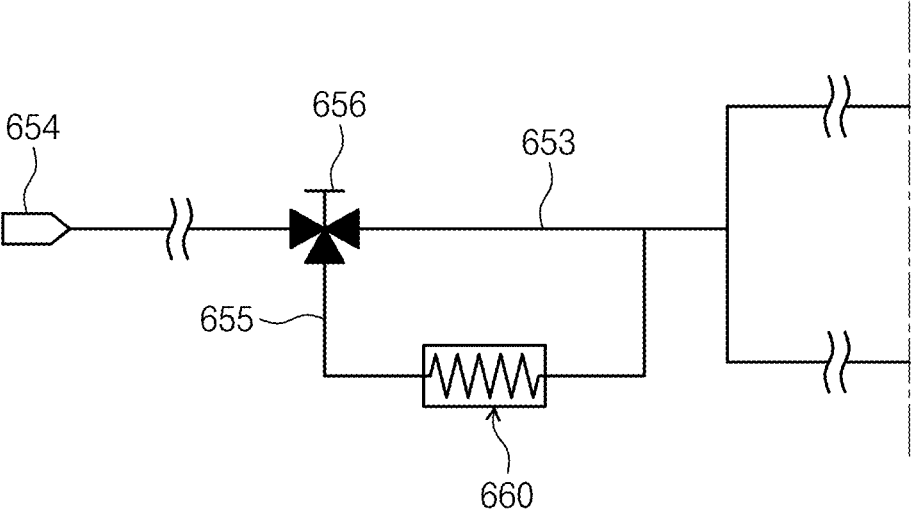
FIG. 9 schematically illustrates a fluid supply unit and a heating unit according to an embodiment.
Figure 10:
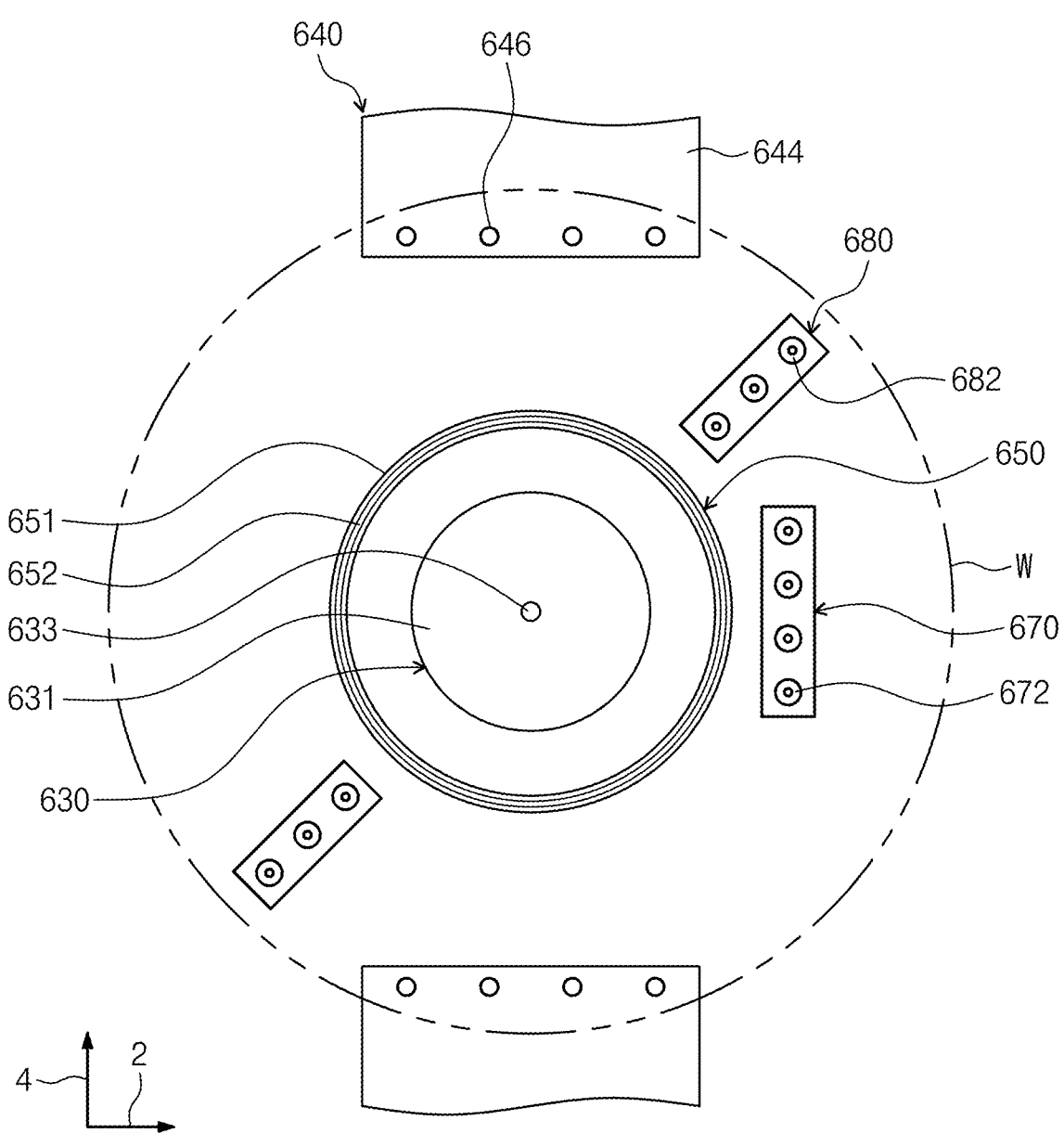
FIG. 10 is a partially enlarged view schematically illustrating a cleaning unit viewed from above according to an embodiment.
Figure 11:
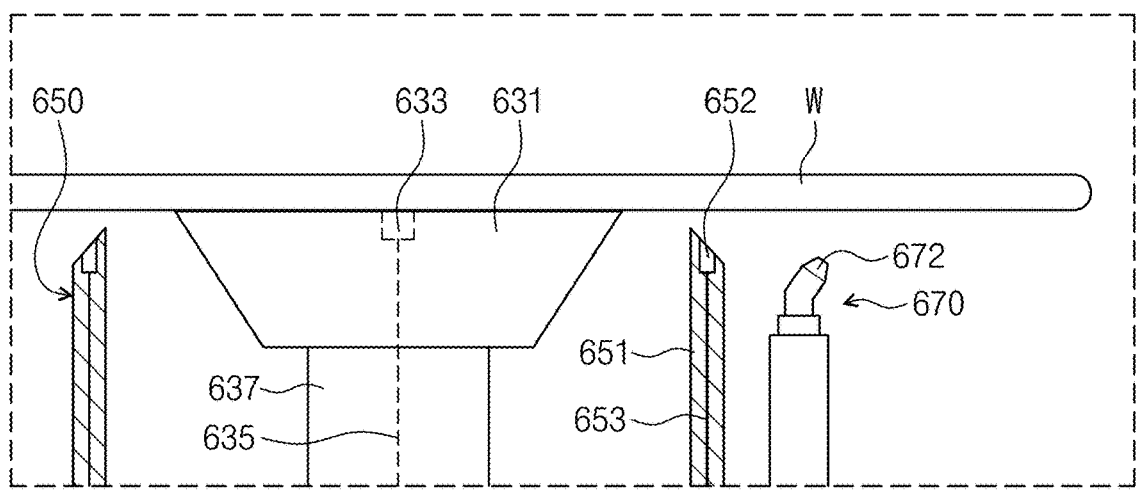
FIG. 11 is a partially enlarged view schematically illustrating a first cleaning unit according to an embodiment from the front.

FIG. 7 is a perspective view schematically illustrating a bottom surface cleaning chamber according to an embodiment. FIG. 8 is a cross-sectional view schematically showing a bottom surface cleaning chamber according to an embodiment. FIG. 9 schematically illustrates a fluid supply unit and a heating unit according to an embodiment. FIG. 10 is a partially enlarged view schematically illustrating a cleaning unit viewed from above according to an embodiment. FIG. 11 is a partially enlarged view schematically illustrating a first cleaning unit viewed from the front according to an embodiment.

The bottom surface cleaning chamber 600 may include a housing 610, a treating container 620, supports 630 and 640, a fluid supply unit 650, a heating unit 660, and cleaning units 670 and 680.

The housing 610 may have a substantially hexahedral shape (e.g., a rectangular cuboid which may be cube). According to an embodiment, the housing 610 may have a hexahedral shape with an open top part. Although not shown, the open top part of the housing 610 may be sealed by a cover.

The housing 610 provides an enclosed inner space. In the inner space of the housing 610, the treating containers 620, the supports 630, 640, the fluid supply unit 650, and cleaning units 670 and 680, which will be described later, are positioned. An exhaust hole (not shown) may be formed at a bottom of the housing 610 and connected to a pump to apply a negative pressure to the inner space of the housing 610 to exhaust an atmosphere of the inner space of the housing 610. In addition, a recycling line 612 may be connected to the bottom of the housing 610. The recycling line 612 may be positioned inside the treating container 620 to be described later when viewed from above. The recycling line 612 may collect a liquid supplied by the cleaning units 670 and 680 to a bottom surface of the substrate W, which will be described later. The liquid collected by the recycling line 612 may be reused in an outer regeneration system (not shown).

A guide rail 614 is installed on a sidewall (outer surface) of the housing 610. A plurality of guide rails 614 may be provided. Some of the plurality of guide rails 614 may be installed on one sidewall of the housing 610, and others of the plurality of guide rails 614 may be installed on the other opposing sidewall of the housing 610. The guide rail 614 has a lengthwise direction parallel to the first direction 2.

The treating container 620 may be a cylinder with an open top part and closed bottom (which may be closed by the bottom plate of housing 610). The treating container 620 generally has a ring shape. The treating container 620 has a treating space 621. The treating space 621 provides a space in which the substrate W is treated. In the treating space 621, a spin chuck 631, a portion of a side chuck 644, a body 651, a first nozzle 672, and a second nozzle 682 (to be described later) are positioned. In addition, the treating container 620 may surround the substrate W supported by the first support 630 or the second support 640.

The treating container 620 may include a side portion 622 (e.g., a cylindrical wall) and an inclined portion 624 (e.g., a rim attached to the side portion 622). The side portion 622 and the inclined portion 624 may be integrally formed. In addition, the side portion 622 and the inclined portion 624 may be made of the same material. The side portion 622 generally has a ring shape. In addition, the side portion 622 may be inclined upwardly as it extends from the side portion 622 towards the center of the treating container 620. When formed as a cylinder, of the inner diameter of the side portion 622 (is larger than that of the substrate W. Openings are defined in the side portion 622. Side chucks 644 (to be described later) are inserted into the openings of the side portion 622.

The inclined portion 624 generally has a ring shape. The inclined portion 624 is formed along a circular end of the side portion 622. In addition, the inclined portion 624 upwardly extends from an end of the side portion 622 toward the center of the treating container 620. The inclined portion

624 extends toward a center of the substrate W supported by the first support 630 or the second support 640. In addition, the inclined portion 624 may be upwardly inclined with respect to the ground toward a top end thereof.

The supports 630 and 640 are positioned in the inner space of the housing 610. The supports 630 and 640 support the substrate W. More specifically, the supports 630 and 640 contact and support the bottom surface of the substrate W. The bottom surface of the substrate W to be described below may be the backside of the substrate W, an inactive surface of the substrate W on and in which transistors and logic circuits are not formed. The bottom surface of the substrate W may be the surface of the base substrate (e.g., the surface of the bulk silicon substrate) opposite to an active surface of the base substrate on and in which transistors and logic circuits are formed. In some examples, the bottom surface of the substrate may not have additional layers and/or various patterns (for forming an integrated circuit of a semiconductor chip) formed thereon (e.g., in some examples, it may be a non-patterned surface). On the contrary, the top surface of the substrate W may be the surface of the substrate W corresponding to the active surface of the base substrate in and on which various patterns forming the integrated circuit of the semiconductor chip are formed (e.g., it may be a patterned surface). The supports 630 and 640 include a first support 630 and a second support 640.

The first support 630 supports a first region of the substrate W. The first region according to an embodiment may be a center region of the substrate W. A second region of the substrate W may be an edge region (extending inwardly from the edge of the substate W) surrounding the first region. The third region of the substrate W may be an intermediate region between the first region and the second region. Accordingly, the first support 630 exposes the edge region of the substrate W while supporting the center region of the substrate W. In addition, the first support 630 rotates the substrate W. That is, the first support 630 rotates the substrate W while supporting the center region of the substrate W.

The second support 640 supports the second region of the substrate W. Accordingly, the second support 640 expose the center region of the substrate W while supporting the edge region of the substrate W.

The first support 630 may include a spin chuck 631, a spin shaft 637, and a shaft driver 639.

The substrate W is mounted on a top surface of the spin chuck 631. The spin chuck 631 has a substantially circular shape when viewed from above. The spin chuck 631 has a diameter smaller than that of the substrate W. A vacuum adsorption hole 633 may be formed in a top portion of the spin chuck 631. In some examples, a plurality of vacuum adsorption holes 633 may be formed on the top portion of the spin chuck 631. The vacuum adsorption hole(s) 633 is/are connected to a vacuum line 635. The vacuum line 635 pass through inside of the spin chuck 631 and inside of the spin shaft 637 to be described later. One end of the vacuum line 635 is connected to the vacuum adsorption hole(s) 633, and the other opposing end is connected to a pump applying a negative pressure (i.e., suction). Accordingly, the vacuum adsorption hole 633 fixes the substrate W seated on a top surface of the spin chuck 631 to the spin chuck 631 by a vacuum adsorption. The vacuum adsorption hole 633 is not limited to a circular shape and may be provided in various shapes, such as having a slit shape (e.g., formed as one or more grooves in the top surface of the spin chuck 631) instead of a circular shape.

The spin shaft 637 is coupled to the spin chuck 631. More specifically, the spin shaft 637 is coupled to a lower surface of the spin chuck 631. The spin shaft 637 has a lengthwise direction parallel to the third direction 6. The spin shaft 637 is coupled to the shaft driver 639. The shaft driver 639 rotates the spin shaft 637 about the axis of the spin shaft 637. The shaft driver 639 may be any one of known motors which transmit a rotational force. In addition, the shaft driver 639 may move the spin shaft 637 in a direction parallel to the third direction 6. Accordingly, the substrate W seated on the spin chuck 631 may move up and down (along the third direction 6) and may rotate about the third direction 6.

The second support 640 may include a bracket 642 and a side chuck 644.

The bracket 642 may have a 'U' shape. The bracket 642 may be positioned on the sidewall of the housing 610. In addition, the bracket 642 is disposed on the guide rail 614. The bracket 642 is coupled to the side chuck 644 to be described later. In addition, the bracket 642 is coupled to the bracket driver 648. The bracket 642 is moved along a lengthwise direction of the guide rail 614. Accordingly, the side chuck 644 may move linearly along the guide rail 614 with the bracket 642. For example, the side chuck 644 may forwardly and backwardly move in the first direction 2.

The side chuck 644 may generally have a plate shape. The side chuck 644 is coupled to an end of the bracket 642. The side chuck 644 is inserted into the opening of the side portion 622 and extends inside the treating container 620 to support the edge region of the substrate. Accordingly, if the side chuck 644 moves in the first direction 2, the side chuck 644 contacts the treating container at the opening, and the treating container 620 may also move in the first direction 2 with the side chuck 644. The substrate W is mounted on a top surface of the side chuck 644. At least one vacuum adsorption hole 646 may be formed in a top portion of the side chuck 644. The vacuum adsorption hole 646 is connected to a line applying a vacuum, which is not shown, and thus fixes the substrate W to the side chuck 644 by vacuum adsorption. The vacuum adsorption hole 646 may be provided in plural, and have the same configurations and operations as described herein with respect to vacuum adsorption hole(s) 633. Accordingly, the substrate W seated on the top surface of the side chuck 644 is fixed to the side chuck 644 by the vacuum adsorption hole 646.

The fluid supply unit 650 supplies a fluid to the treating space 621. More specifically, the fluid supply unit 650 supplies the fluid to the bottom surface of the substrate W supported by the supports 630 and 640. The fluid according to an embodiment may be a gas, such as air.

The fluid supply unit 650 may include a body 651, a groove 652, a main pipe 653, and a bypass pipe 655.

The body 651 may have a cylindrical shape with an open top. The body 651 is disposed to surround an outside of the spin chuck 631 and the spin shaft 637. The body 651 is positioned between the spin chuck 631 and the side portion 622 of the treating container 620. A top of the body 651 is positioned at a height lower than the substrate W supported by the spin chuck 631 or the substrate W supported by the side chuck 644. In addition, the top end of the body 651 may be formed to be inclined. For example, if viewed from the front, the top surface of the body 651 may be formed to be downwardly inclined toward the edge of the substrate W. However, the inventive concept is not limited thereto, and the top surface of the body 651 may be formed to be flat.

In addition, a groove 652 is formed in the top surface of the body 651. The groove 652 according to an embodiment may be a ring-shaped channel. Accordingly, the groove 652 may be formed along a circumferential direction of the body 651. However, the inventive concept is not limited thereto, and the groove 652 may be replaced with a plurality of circular holes regularly spaced along the circumferential direction of the body 651.

One end of the main pipe 653 is connected to the groove 652, and the other opposing end thereof is connected to a fluid supply source 654. Accordingly, the fluid is supplied to the groove 652 through the main pipe 653. In addition, the main pipe 653 may be branched into a plurality of pipes and connected to different points of the groove 652. For example, the main pipe 653 may be branched into two pipes and with one pipe connected to one point of the groove 652 and the other pipe connected to another point of the groove 652, respectively. The one point and the other point may be points on opposite sides of the groove.

Referring to FIG. 9, a bypass pipe 655 may also be used to supply the fluid to the groove 652 by bypassing a portion of the main pipe 653. More specifically, the bypass pipe 655 is connected to an upstream point of the main pipe 653 and a downstream point of the main pipe 653 to bypass the portion of the main pipe 653 between the upstream point and the downstream point. A fluid valve 656 is installed at the upstream point of the main pipe 653 to which one end of the bypass pipe 655 is connected. The fluid valve 656 may change a flow destination of the fluid. More specifically, the fluid valve 656 may change fluid flow from flowing through the entire main pipe 653 to flow through the bypass pipe 655 into the groove 652. Selectively, the fluid valve 656 may flow the fluid to the groove 652 through the main pipe 653 without going through the bypass pipe 655 or may flow the fluid to the groove 652 through the bypass pipe 655. According to an embodiment, the fluid valve 656 may be a 3-way valve.

The heating unit 660 may be installed in the bypass pipe 655. The heating unit 660 may raise a temperature of the fluid flowing through the bypass pipe 655. The heating unit 660 may reduce a relative humidity of the treating space 621 by supplying a heated fluid to the treating space 621 through the groove 652. A detailed mechanism for this will be described later. The heating unit 660 may be a heater, such as a resistance heating element that generates a heat in response to a supplied current. The heating unit 660 according to an embodiment may heat the temperature of the fluid flowing through the bypass pipe 655 to a temperature of 23° C. or higher.

The cleaning units 670 and 680 supply the liquid to the substrate W supported by the supports 630 and 640. More specifically, the cleaning units 670 and 680 clean the bottom surface of the substrate W by supplying the liquid to the bottom surface of the substrate W supported by the supports 630 and 640. The cleaning units 670 and 680 may thus clean a non-patterned surface (e.g., the backside) of the substrate W. The liquid according to an embodiment may include at least one of deionized water, water diffused with carbon dioxide, water diffused with ozone, water diffused with, and/or water diffused with ammonia (the water diffused with a gas or liquid may be deionized water). The water diffused with The cleaning units 670 and 680 may include a first cleaning unit 670 and a second cleaning unit 680.

The first cleaning unit 670 cleans the center region among the entire bottom surface region of the substrate W. More specifically, the first cleaning unit 670 cleans the center region of the substrate W while the second support 640 supports the edge region of the substrate W and the support 630 does not support the substrate W. A mechanism by which the first cleaning unit 670 cleans the center region of the substrate W will be described later.

The first cleaning unit 670 is positioned within the treating container 620. When viewed from above, the first cleaning unit 670 is positioned between the body 651 and the side portion 622. The first cleaning unit 670 includes at least one first nozzle 672. If a plurality of first nozzles 672 are provided, the plurality of first nozzles 672 may be spaced apart from each other in the second direction 4. The first nozzle 672 is supported by a bracket coupled to a bottom of the housing 610. The first nozzle 672 discharges a liquid to the center region of the substrate W. The first nozzle 672 may be formed to be inclined. More specifically, the first nozzle 672 may be formed to be upwardly inclined toward the edge region of the substrate W when viewed from the front.

The second cleaning unit 680 cleans the edge region of the entire bottom surface region of the substrate W. In more detail, the second cleaning unit 680 cleans the edge region of the substrate W while the first support 630 supports the center region of the substrate W and the support 640 does not support the substrate W. A detailed mechanism by which the second cleaning unit 680 cleans the edge region of the substrate W will be described later.

The second cleaning unit 680 is positioned within the treating container 620. In addition, the second cleaning unit 680 is positioned between the body 651 and the side portion 622 when viewed from above. In addition, the second cleaning unit 680 is disposed at a position which does not interfere with the first cleaning unit 670. The second cleaning unit 680 may include a plurality of second nozzles 682. The second nozzles 682 may be spaced apart from each other. The plurality of second nozzles 682 may be spaced apart from each other in an offset direction with respect to the first direction 2. For example, the plurality of second nozzles 682 may be spaced apart from each other on a plane including the first direction 2 and the second direction 4 to define a line having an acute angle with respect to the first direction 2 and the second direction 4. In addition, the plurality of second nozzles 682 may be supported by a bracket installed on the bottom of the housing 610.

The second nozzle 682 sprays a liquid toward the edge region of the substrate W. More specifically, some of the plurality of second nozzles 682 may be located at a first position to spray the liquid onto corresponding edge regions of the substrate W supported by the first support 630. In addition, some other of the plurality of second nozzles 682 may be located to a second opposing position to spray the liquid to corresponding edge region of the substrate W supported by the first support 630.

Hereinafter, a substrate treating method according to an embodiment will be described. The substrate treating method may be used in the manufacturing of semiconductor devices. The substrate treating method described below may be performed by the substrate treating apparatus described with reference to FIG. 1 to FIG. 11. Accordingly, hereinafter, the substrate treating method according to an embodiment will be described by citing the reference numerals shown in FIG. 1 to FIG. 11. In addition, the substrate treating method described below may be performed by controlling components included in the substrate treating apparatus, which are not shown.

The controller (not shown) may comprise a computer including a process controller such as a microprocessor that executes a control program of the substrate treating apparatus 1, a user interface such as a keyboard via which an operator inputs commands to manage the substrate treating apparatus 1, a display showing the operation situation of the substrate treating apparatus 1, and a memory unit storing a treating recipe, i.e., the control program (i.e., software code) to execute the treating processes of the substrate treating apparatus 1. The process controller may be configured by the control program to control the operation of the components of the substrate treating apparatus 1 according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 12:
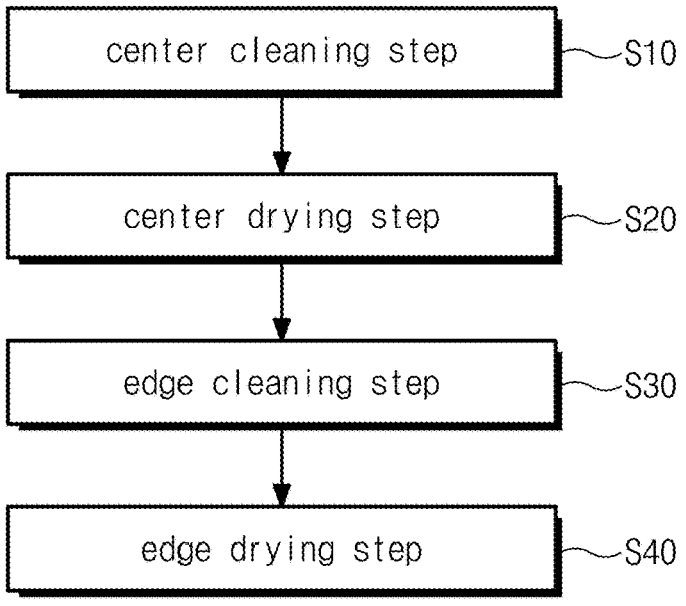
FIG. 12 is a flow chart of a substrate treating method according to an embodiment.
Figure 19:
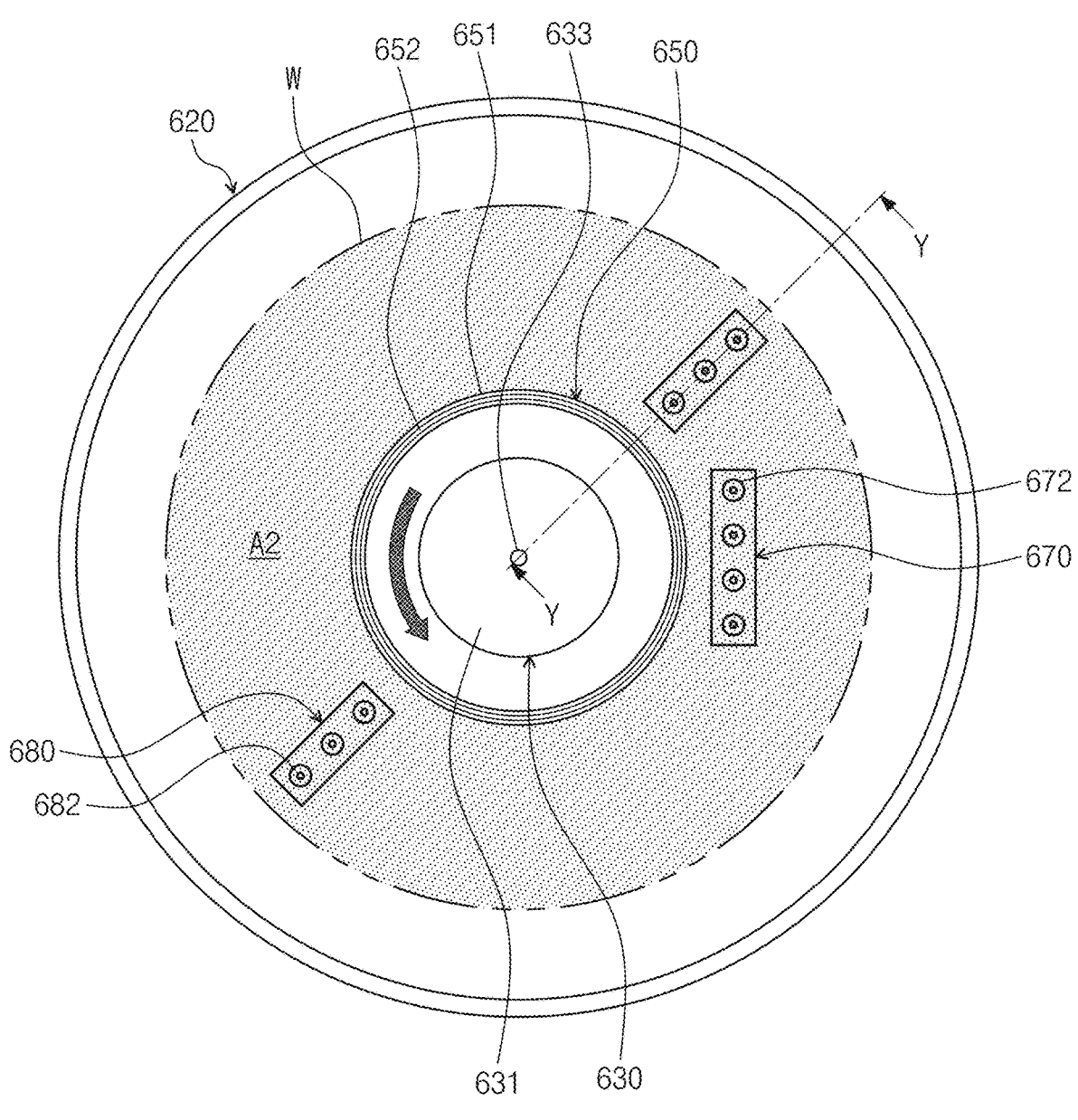
FIG. 19 to FIG. 21 illustrate operations of the substrate treating apparatus for performing an edge cleaning step and an edge drying step according to an embodiment.
Figure 20:
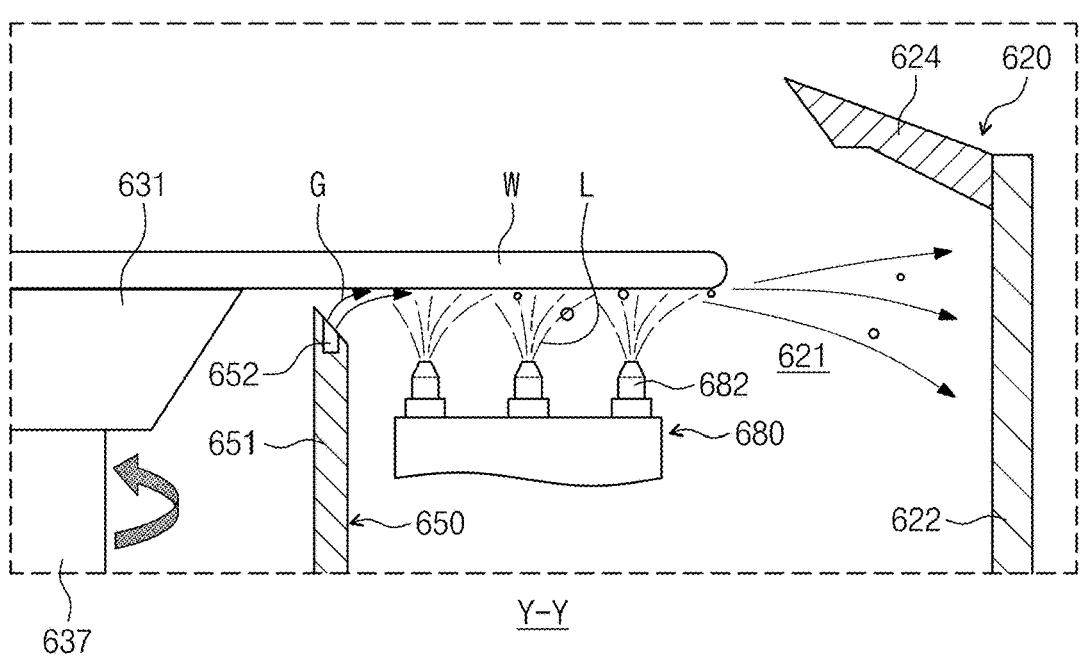
Figure 21:
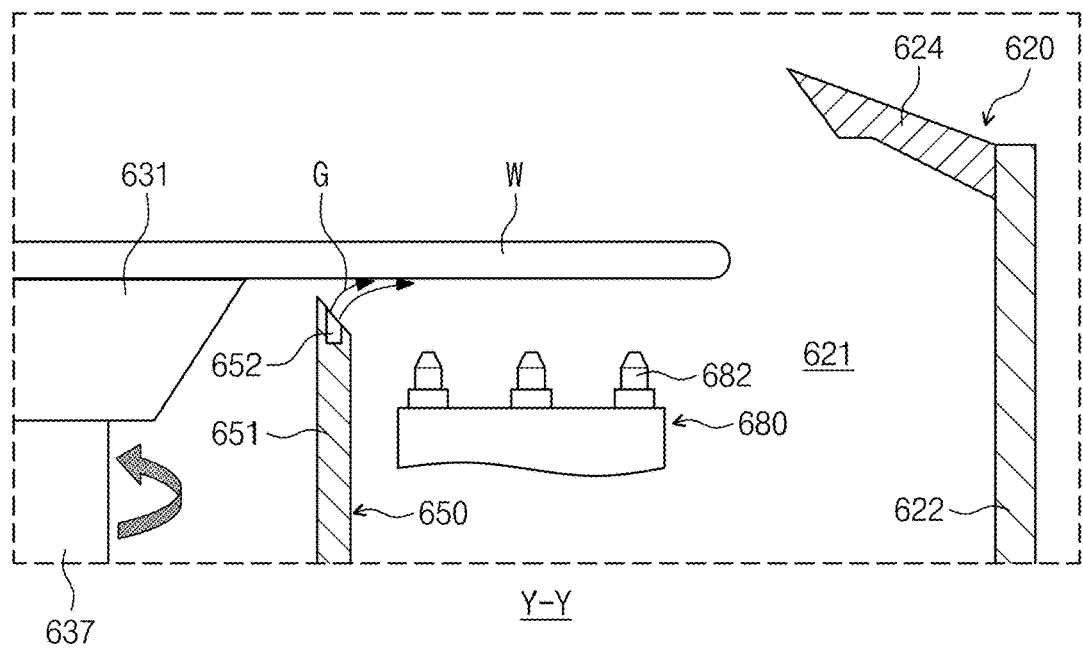

FIG. 12 is a flowchart of a substrate treating method according to an embodiment. FIG. 13 to FIG. 18 illustrate operations of the substrate treating apparatus performing a center cleaning step and a center drying step according to an embodiment. FIG. 19 to FIG. 21 illustrate operations of the substrate treating apparatus for performing an edge cleaning step and an edge drying step according to an embodiment.

The substrate treating method according to an embodiment includes a center cleaning step S10, a center drying step S20, an edge cleaning step S30, and an edge drying step S40.

According to an embodiment, the center cleaning step S10 and the center drying step S20 may be performed sequentially. In addition, the edge cleaning step S30 and the edge drying step S40 may be performed sequentially. According to an embodiment, after treating (e.g., cleaning) the center region of the substrate W, treating (e.g., cleaning) edge region of the substrate W may be performed. However, the inventive concept is not limited thereto, and after treating (e.g., cleaning) the edge region of the substrate W, treating (e.g., cleaning) the center region of the substrate W may be performed. Hereinafter, for convenience of understanding, cleaning the center region of the substrate W and then cleaning the edge region of the substrate W will be described as an example.

Before performing the center cleaning step S10, an external transfer means (e.g., the first robot 552) may deliver the substrate W to the first support 630. The substrate W delivered onto the first support 630 may be a substrate W which has been pre-treated. For example, the substrate W delivered onto the first support 630 may be a substrate W on which a coating process has been performed. For example, the upper surface of the substrate W may comprise a photoresist layer or an antireflection film formed on a photoresist layer.

The spin chuck 631 upwardly moves and the external transfer means delivers the substrate W onto the first support 630. In this case, the spin chuck 631 moves to a position higher than the top end of the treating container 620. The external transfer means transfers the substrate W to the spin chuck 631. The spin chuck 631, which has received the substrate W, moves downward. For example, the spin chuck 631 descends until the top end of the spin chuck 631 is at a position that is below the top end of the side chuck 644. In a process of descending the spin chuck 631, the substrate W is transferred to the top surface of the side chuck 644. When the substrate W is seated on the side chuck 644, the vacuum adsorption hole 646 fixes the substrate W in a vacuum adsorption manner. Accordingly, the second support 640 fixes and supports the edge region of the substrate W and while the center region of the substrate W is exposed within the treating space 621.

When the second support 640 fixes and supports the edge region of the substrate W, the side chuck 644 moves to a center cleaning position. The center cleaning position can be a position at which the center region of the substrate W fixedly supported by the side chuck 644 and the first nozzle 672 overlap each other when viewed from above. When the side chuck 644 is completely moved to the center cleaning position, e.g., when the center region of the substrate W is above the first nozzle 672, the center cleaning step S10 is performed. During the center cleaning step S10, the side chuck 644 fixes and supports the substrate W. In addition, while performing the center cleaning step S10, the treating container 620 may move horizontally. As described above, the side chuck 644 may forwardly and backwardly move in the first direction 2 with the bracket 642.

Figure 13:
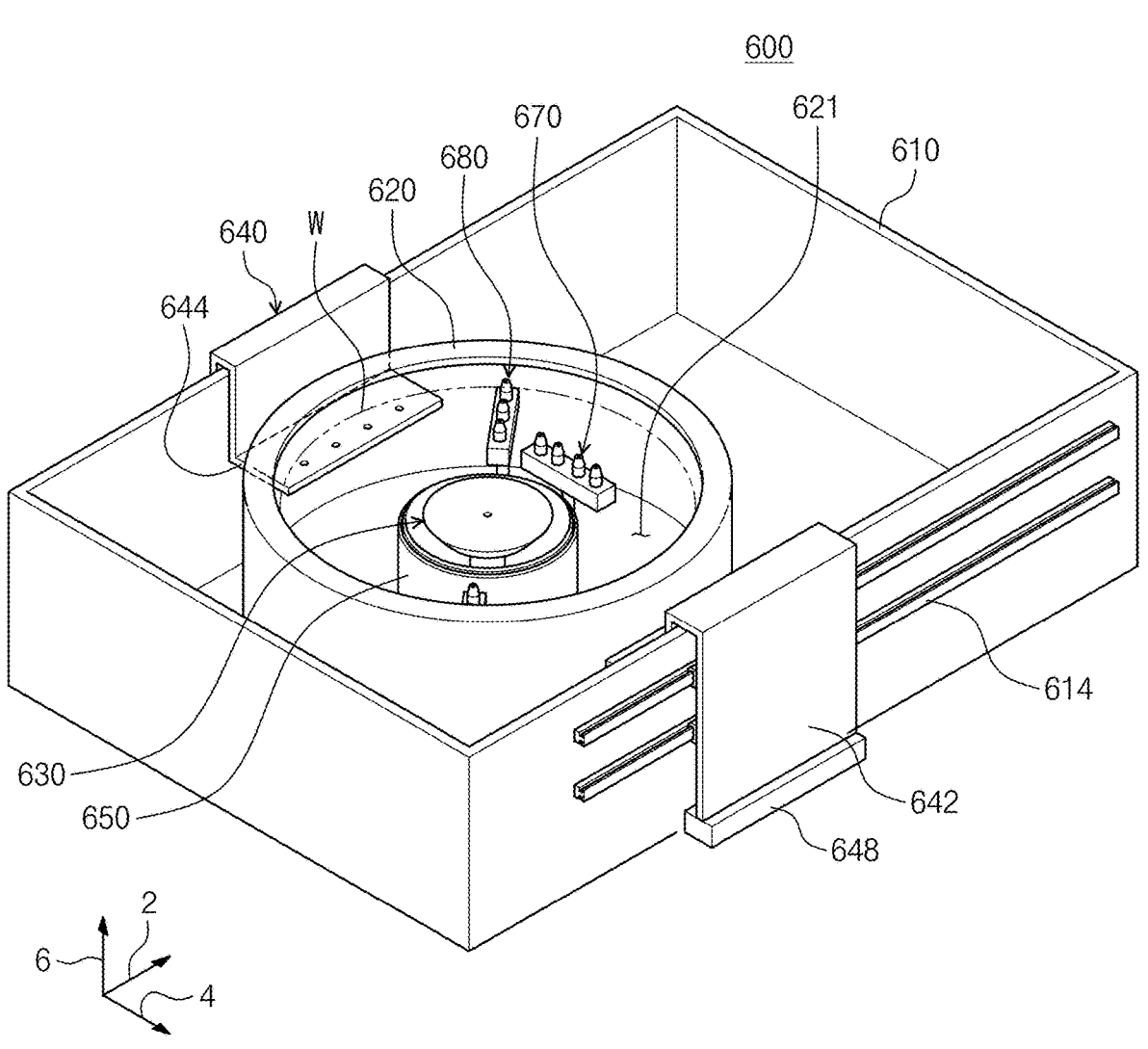
FIG. 13 to FIG. 18 illustrate operations of the substrate treating apparatus for performing a center cleaning step and a center drying step according to an embodiment.
Figure 14:
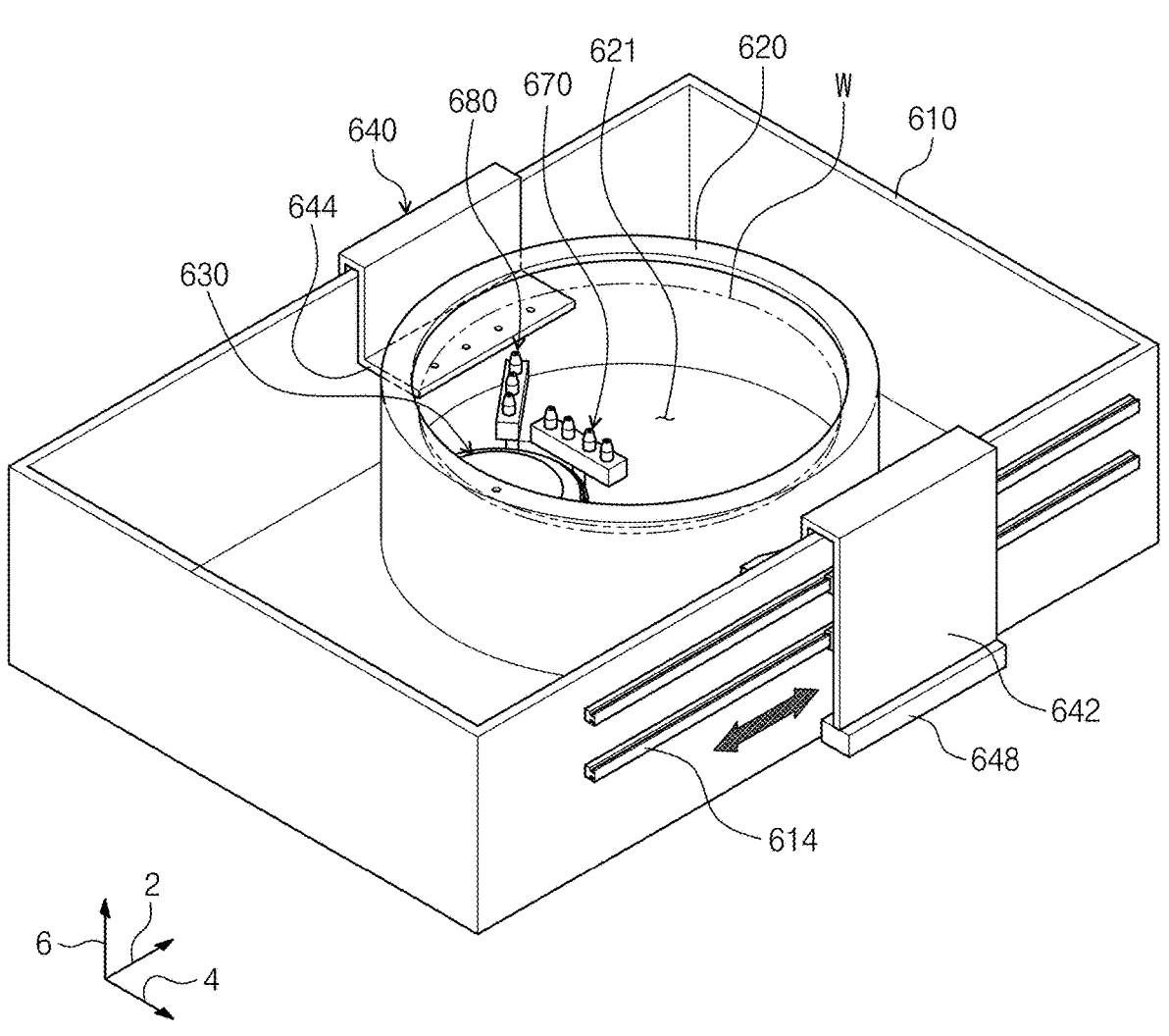

In addition, the side chuck 644 is inserted into the opening formed in the side portion 622 of the treating container 620 to contact and apply a horizontal force in the first direction 2 to the moveable treating container 622. Thus, the treating container 620 moves forwardly and backwardly move along the first direction 2 with the side chuck 644 as shown in FIG. 13 and FIG. 14. The treating container 620 according to an embodiment may move back and forth within a positional range which does not interfere with the first nozzle 672, the second nozzle 682, and the body 651 disposed within.

Figure 15:
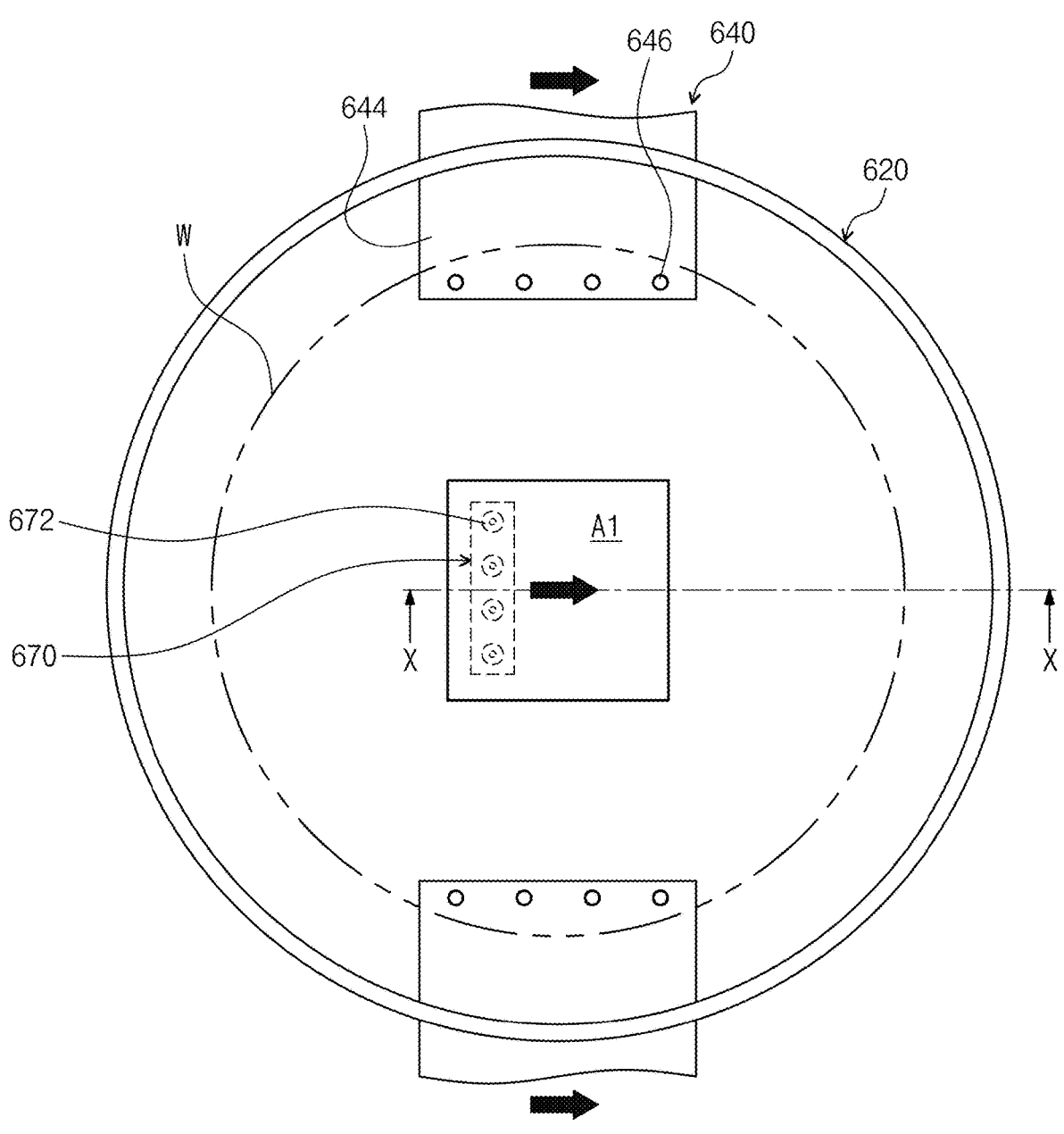
Figure 16:
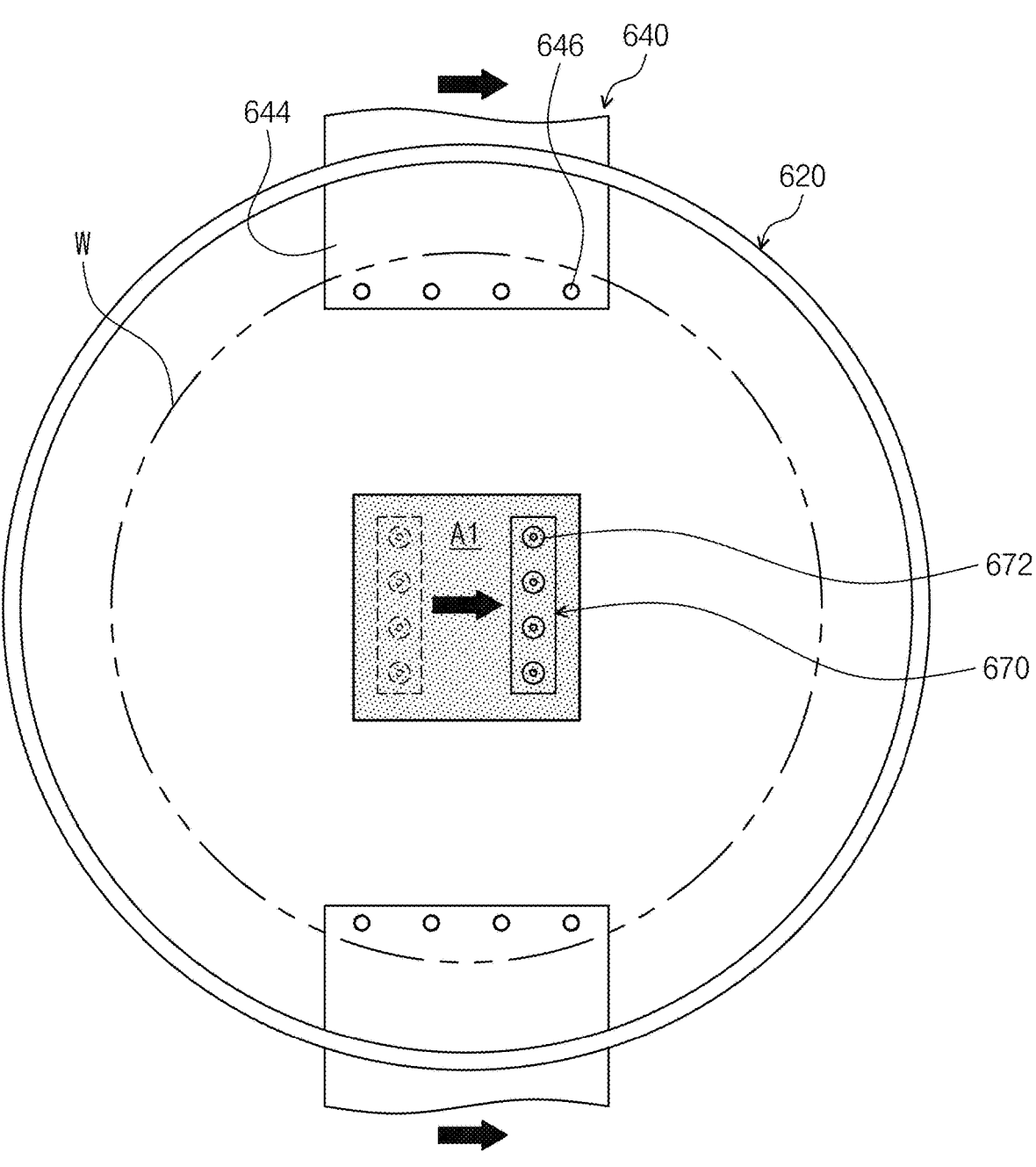

As shown in FIG. 15 and FIG. 16, the first cleaning unit 670 supplies a liquid to the center region A1 of the substrate W while the substrate W moves back and forth on a horizontal plane. According to an embodiment, the substrate W may move back and forth a plurality of times on the horizontal plane in a set number of times according to a recipe (e.g., according to the treating recipe/control program).

Figure 17:
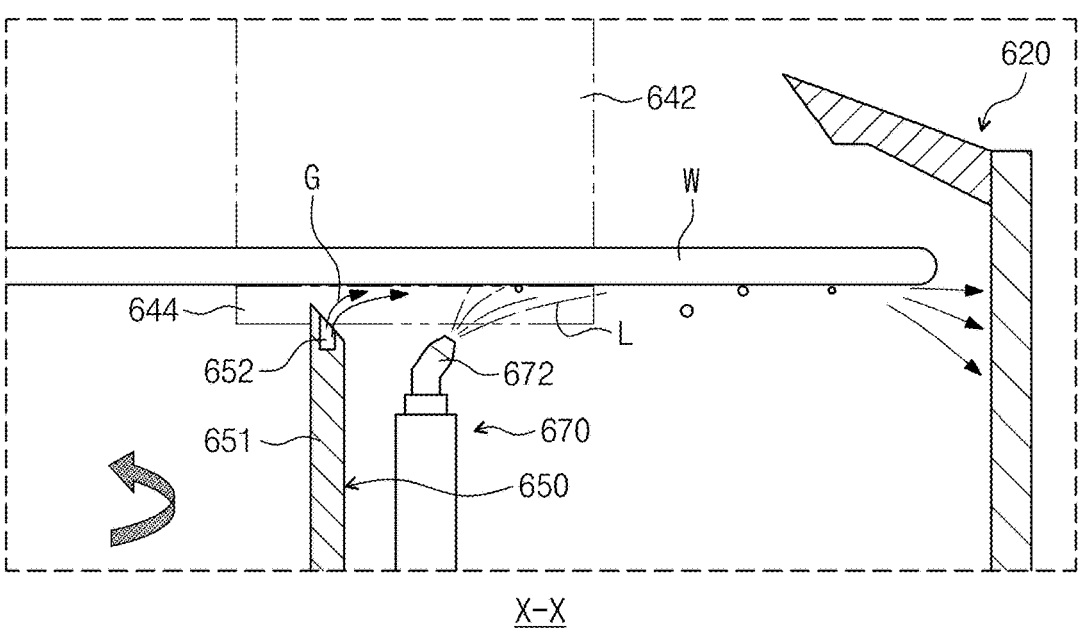
Figure 18:
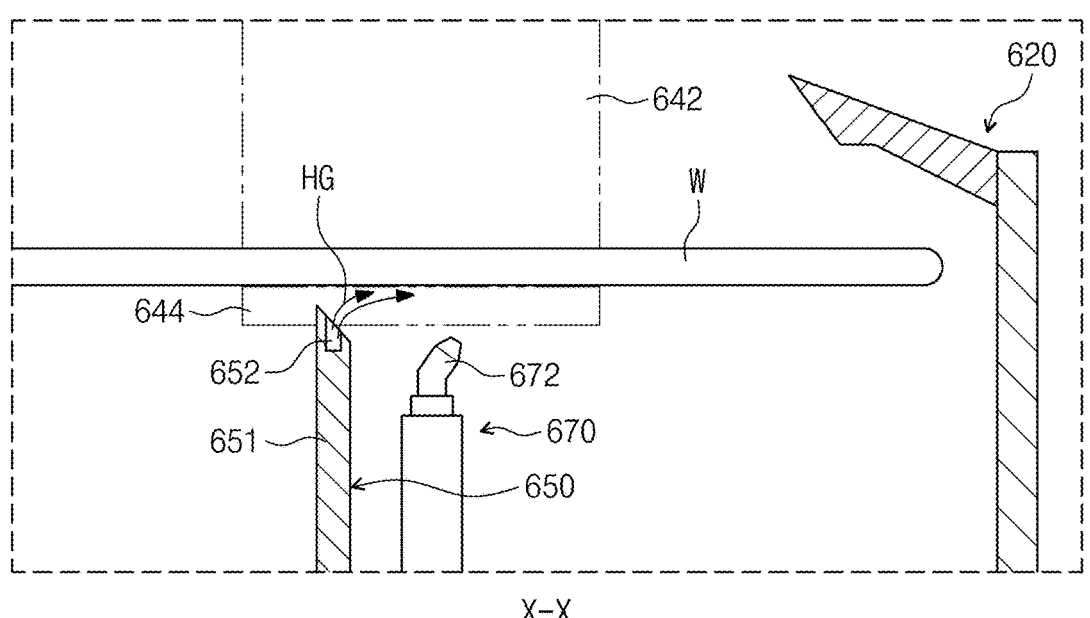

As shown in FIG. 17, the first nozzle 672 discharges the liquid L to the center region of the substrate W. As described above, since the first nozzle 672 is formed to be inclined upward toward an edge of the substrate W when viewed from the front, the liquid discharged from the first nozzle 672 travels upward and outwardly toward the edge region (e.g., supplying the liquid radially outwardly). Accordingly, foreign substances attached to the center region of the substrate W are removed from the substrate W by a liquid discharged from the first nozzle 672 and may be deposited on an inner wall of the treating container 620. The liquid L and foreign substances deposited on the inner wall of the treating container 620 flow along the inner wall of the treating container 620 and are collected by the recycling line 612.

In addition, in the center cleaning step S10, the fluid supply unit 650 supplies the fluid G to the treating space 621. More specifically, the fluid supply unit 650 supplies the fluid G toward the bottom surface of the substrate W. The liquid L and the fluid G may be simultaneously supplied to the center region of the substrate W. In addition, according to an embodiment, the fluid G supplied in the center cleaning step S10 may be supplied to the bottom surface of the substrate W without passing through the bypass pipe 655 (e.g., without heating the fluid G). That is, the fluid supplied in the center cleaning step S10 may be a fluid which is not heated by the heating unit 660 installed in the bypass pipe 655.

As described above, since the top surface of the body 651 is formed to be downwardly inclined toward the edge of the substrate W, the fluid G supplied from the groove 652 to the center area of the substrate W moves toward the edge of the substrate W. The body 651 surrounds the spin chuck 631, and the fluid G supplied from the groove 652 flows toward the edge of the substrate W away from the spin chuck 631. With the discharge of liquid L from the first nozzle 672 being located outside the groove 652 (between the groove 652 and the edge of the substrate W) and the direction of flow of the fluid G pushing the L away from the spin chick 631 to the edge of the substrate W, it is possible to minimize and/or block an inflow of the liquid L discharged from the first nozzle 672 into the spin chuck 631. The liquid L discharged from the first nozzle 672 and foreign substances removed from the center region of the substrate W are deposited on the inner wall of the treating container 620 by the fluid G supplied from the fluid supply unit 650 and flow downwardly along the inner wall of the treating container 620. The liquid L and foreign substances flowing along the inner wall of the treating container 620 are collected by the recycling line 612.

The center drying step S20 is performed after the liquid is discharged to the center region of the substrate W while moving back and forth a set number of times on the horizontal plane according to the recipe. In the center drying step S20, the substrate W may move back and forth on the horizontal plane similar to the center cleaning step S10. That is, while performing the center drying step S20, the substrate W may forwardly and backwardly move in the first direction 2.

While the substrate W moves back and forth on the horizontal plane, the fluid supply unit 650 supplies the fluid to the center region of the substrate W. The fluid supplied to the center region of the substrate W moves flows outwardly to the edge region of the substrate W due to the inclined top structure of the body 651. Accordingly, the liquid remaining in the center region of the substrate W is pushed off the substrate W or dried by the fluid from the fluid supply unit 650. In addition, foreign substances remaining in the center region of the substrate W which are not removed in the center cleaning step S10 are secondarily removed from the substrate W by the fluid from the fluid supply unit 650.

According to an embodiment, in the center drying step S20, a fluid HG which is heated is supplied toward the bottom surface of the substrate W. More specifically, in the center drying step S20, an opening path of a fluid valve 656 is selectively adjusted so that the fluid flows through the bypass pipe 655. In a process of the fluid flowing through the bypass pipe 655, it is heated by the heating unit 660. According to an embodiment, the fluid is heated to a temperature of 23° C. or higher and is supplied into the treating space 621 through the groove 652. The heated fluid HG supplied to the treating space 621 increases the temperature of the treating space 621. Accordingly, a relative humidity of the treating space 621 is reduced. That is, if the fluid heated to a temperature of 23° C. or higher is supplied to the treating space 621, the relative humidity of the treating space 621 may be significantly lowered. If the relative humidity of the treating space 621 decreases, a mist within the treating space 621 due to a pre-supplied liquid may avoid being dropletized, and remain in the atmosphere within the treating space 621. Accordingly, it is possible to minimize a condensation of a liquid remaining in the atmosphere, such as on to the inner wall of the treating container 620 or other portions of the bottom surface cleaning chamber 600. In addition, it is possible to minimize a phenomenon of the liquid remaining on the inner wall of the treating container 620 splattering back to the substrate W to contaminate the substrate W. In addition, the heated fluid HG supplied to the treating space 621 indirectly increases the temperature of the substrate W. Accordingly, a phenomenon in which foreign substances are attached to the substrate W may be minimized.

After the center drying step S20 is performed, the side chuck 644 transfers the substrate W to the spin chuck 631.

More specifically, after the side chuck 644 is moved so that the center of the substrate W coincides with the center of the spin chuck 631, the spin chuck 631 moves upwardly until a top surface of the spin chuck is higher than a top surface of the side chuck 644. In the process of upwardly moving the spin chuck 631, the substrate W is seated on the top surface of the spin chuck 631 and removed from the side chuck 644. When the substrate W is seated on the top surface of the spin chuck 631, the vacuum adsorption hole 633 fixes and supports the substrate W in a vacuum adsorption manner.

The spin chuck 631 moves upwardly to an edge cleaning position. The edge cleaning position according to an embodiment may be a position at which the top end of the substrate W supported by the spin chuck 631 is at a height lower than the top end of the treating container 620. In addition, the edge cleaning position may be a position at which the bottom end of the substrate W supported by the spin chuck 631 is higher than a top end of the second nozzle 682. In addition, the edge cleaning position may be a position at which the bottom end of the substrate W supported by the spin chuck 631 is higher than the top end of the side chuck 644.

When the spin chuck 631 moves to the edge cleaning position, the edge cleaning step S30 may be performed. The shaft driver 639 rotates the spin chuck 631, and the substrate W fixedly supported by the spin chuck 631 also rotates. Although FIG. 19 illustrates that the substrate W supported by the spin chuck 631 rotates counterclockwise, the substrate W may rotate clockwise.

As shown in FIG. 19 and FIG. 20, the second cleaning unit 680 supplies a liquid L to the edge region A2 of a rotating substrate W to clean the edge region A2 of the substrate W. More specifically, when viewed from above, the second nozzle 682 is positioned to overlap the edge region A2 of the substrate W and discharges the liquid L to the edge region A2 of the substrate W. The foreign substances attached to the edge area A2 of the substrate W may be removed from the bottom surface of the substrate W by the liquid L discharged to the edge area A2 of the substrate W.

In addition, as shown in FIG. 20, the fluid supply unit 650 supplies the fluid G to the treating space 621. More specifically, the fluid supply unit 650 supplies the fluid G toward the bottom surface of the substrate W. The liquid L and fluid G may be simultaneously supplied to the edge region of the substrate W. In addition, according to an embodiment, the fluid supplied in the edge cleaning step S30 may be supplied to the bottom surface of the substrate W without passing through the bypass pipe 655. That is, the fluid supplied in the edge cleaning step S30 may be a fluid which is not heated by the heating unit 660. The liquid L discharged from the second nozzle 682 and foreign substances removed from the substrate W are deposited on the inner wall of the treating container 620 by the fluid G supplied from the fluid supply unit 650 and flow along the inner wall of the treating container 620. The liquid L and foreign substances flowing along the inner wall of the treating container 620 are collected by the recycling line 612.

As described above, since the edge cleaning step S30 cleans the edge region of the substrate W while rotating the substrate W, the atmospheric pressure of the space below the substrate W increases. That is, the atmospheric pressure of the treating space 621 increases, and as a result, a large amount of mist may be generated within the treating space 621. As described above, the heated fluid may be supplied to the treating space 621 before performing the edge cleaning step S30. According to the above-described embodiment, since a relative humidity of the treating space 621 is rapidly reduced in the center drying step S20 before performing the edge cleaning step S30, a mist increase phenomenon in the treating space 621 due to a rotation of the substrate W in the edge cleaning step S30 may be suppressed. Accordingly, a phenomenon in which foreign substances are attached and deposited on the treating container 620 and/or the substrate W may be minimized.

After supplying the liquid L and the fluid G toward the edge region of the substrate W while rotating the substrate W a preset number of times according to the recipe, the edge drying step S40 is performed. In the edge drying step S40, the substrate W is rotated to dry the substrate W. In addition, as shown in FIG. 21, in the edge drying step S40, the fluid supply unit 650 supplies fluid toward the edge region of the rotating substrate W. The liquid remaining in the edge region of the substrate W is removed or dried by the supplied fluid G. In addition, foreign substances which are not removed in the edge cleaning step S30 and remain may be secondarily removed by the supplied fluid G.

In the above-described example, the fluid is supplied toward the bottom surface of the substrate W in all of the center cleaning step S10, the center drying step S20, the edge cleaning step S30, and the edge drying step S40, but the inventive concept is not limited thereto. For example, the fluid may be supplied toward the bottom surface of the substrate W in at least one (e.g., one, some or all) of the center cleaning step S10, the center drying step S20, the edge cleaning step S30, and/or the edge drying step S40.

In addition, in the above example, supplying the heated fluid toward the bottom surface of the substrate W only in the center drying step S20 has been described, but the inventive concept is not limited to this. For example, the heated fluid may be supplied toward the bottom surface of the substrate W in at least one (e.g., one, some or all) of the center cleaning step S10, the center drying step S20, the edge cleaning step S30, and/or the edge drying step S40.

After the cleaning of the substrate, the manufacturing method may further include moving the substrate to the exposure apparatus 90, selectively exposing the photoresist layer on the substrate vie a photolithography exposure operation by the exposure apparatus 90. After this exposure process, the substrate may be transferred to a developing block 20a to develop the photoresist to pattern the photoresist layer by supplying a developing liquid to the substrate. The pattern photoresist layer may then be used to etch a layer of the substrate (directly or indirectly with use of a hard mask and/or additional selective etch processes) to form a desired pattern on the substrate (e.g., a patterned insulating layer, a patterned conductive layer, contact holes, etc.) and thereby form semiconductor devices (integrated circuits) with the substrate W. The substrate W may be cut to separate the semiconductor devices from each other to obtain a plurality of semiconductor chips.

Hereinafter, a heating unit according to another embodiment of the inventive concept will be described. The heating unit described below is mostly the same as or similar to the configuration of the heating unit described above, except for the case to be additionally described. Accordingly, a description of the overlapping configuration will be omitted.

Figure 22:
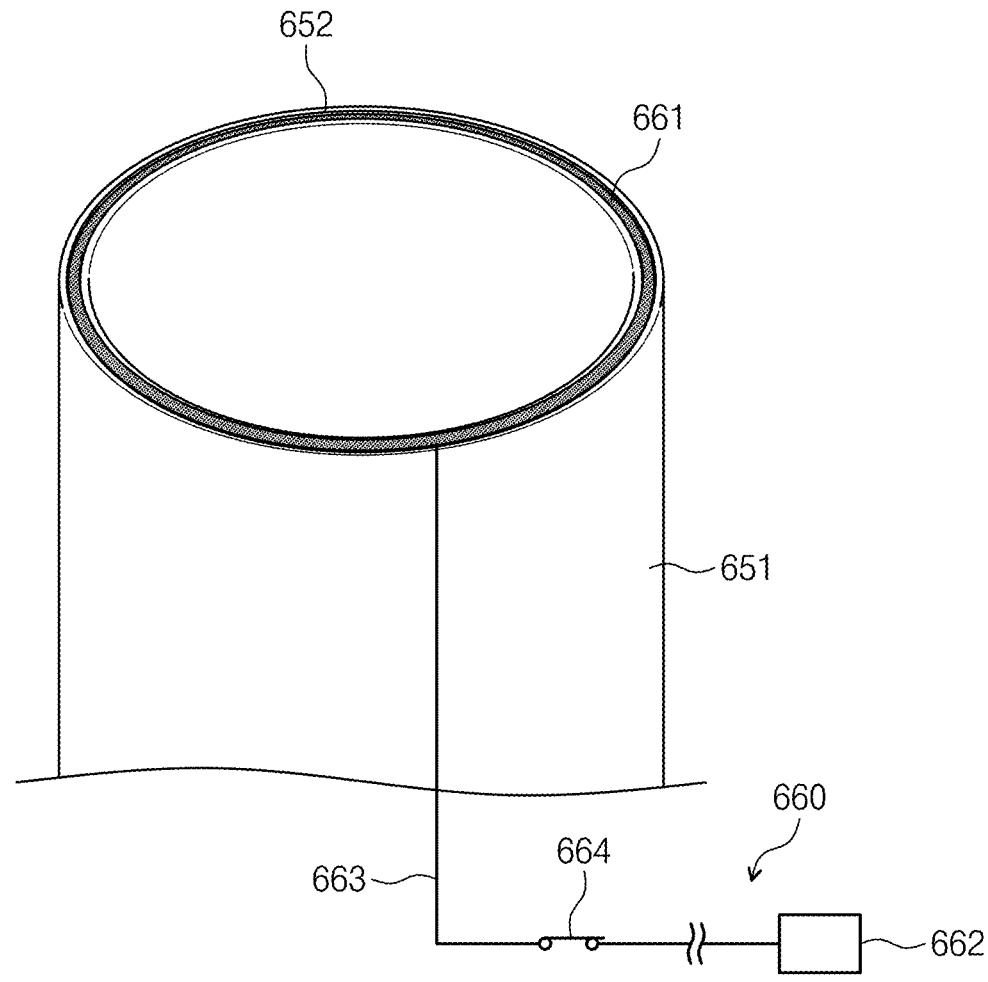
FIG. 22 to FIG. 24 schematically illustrates a heating unit according to another embodiment.
Figure 23:
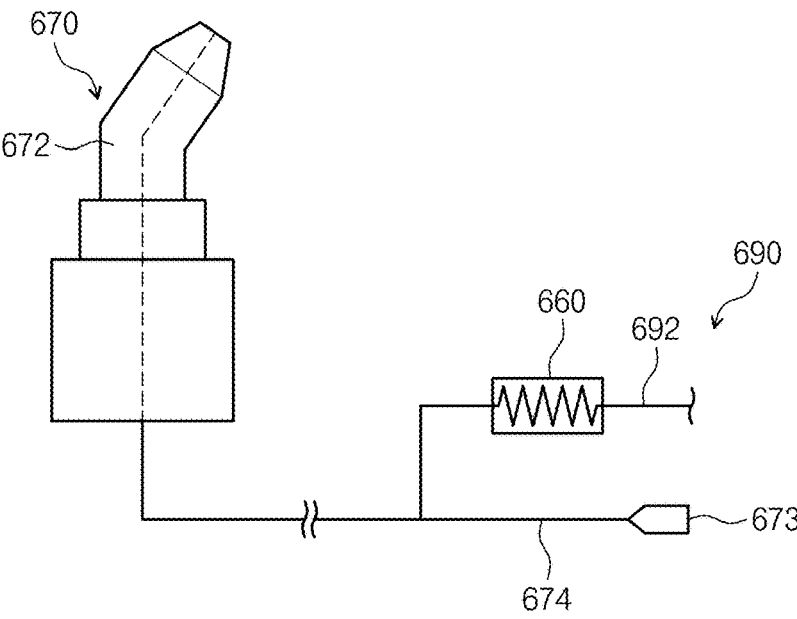
Figure 24:
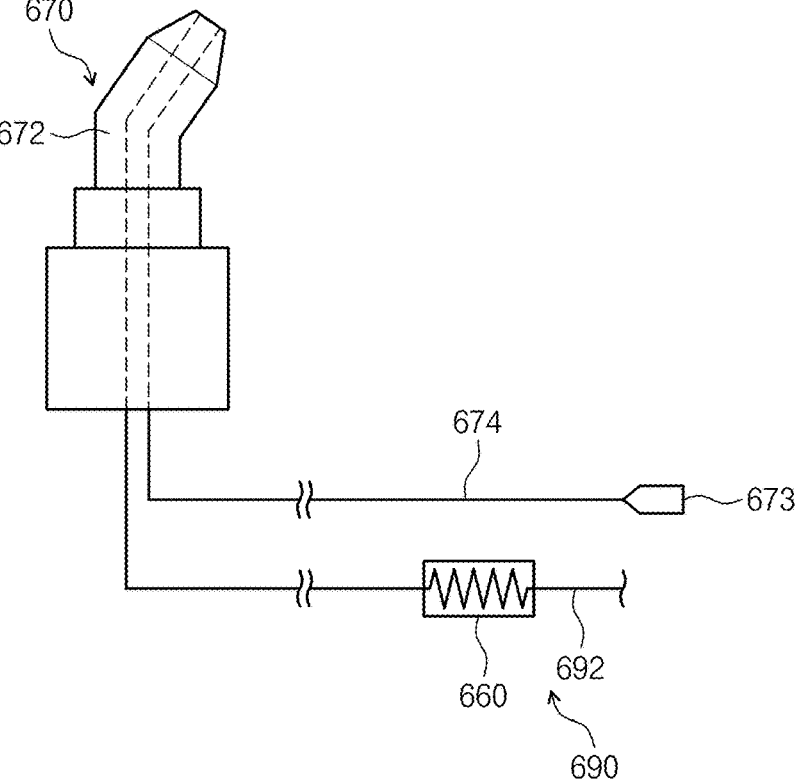

FIG. 22 to FIG. 24 schematically illustrate the heating unit according to alternative embodiments.

Referring to FIG. 22, the heating unit 660 may include a heating wire 661 (or another resistive heating element), a power supply 662, a power supply line 663, and a power switch 664. The heating wire 661 according to an embodiment may have a ring shape. The heating wire 661 may be inserted into the groove 652 formed at the top end of the body 651. The heating wire 661 may be electrically connected to the power supply 662 via the power supply line 663. In addition, the power switch 664 may be installed on the power supply line 663. Whether the heating wire generates a heat may be determined according to an ON or an OFF of the power switch 664. For example, if the power switch 664 is turned on, a current flows through the heating wire 661, and the heating wire 661 generates the heat by resisting the flowing current. Accordingly, the heating wire 661 may increase the temperature of the fluid supplied through the groove 652.

Referring to FIG. 23, the first cleaning unit 670 may include a first nozzle 672, a liquid supply source 673, and a liquid supply pipe 674. Since the first nozzle 672 has mostly the same or similar structure as the above-described embodiment, a redundant description thereof will be omitted. One end of the liquid supply pipe 674 is connected to an outlet formed at a top end of the first nozzle 672. In addition, the other end of the liquid supply pipe 674 is connected to the liquid supply source 673.

In addition, the bottom surface cleaning chamber 600 may further include a heating fluid supply unit 690. The heating fluid supply unit 690 supplies the heated fluid to the treating space through the first cleaning unit 670. The heating fluid supply unit 690 may include a heating fluid supply pipe 692. One end of the heating fluid supply pipe 692 is connected to a fluid supply source, and the other end is connected to the liquid supply pipe 674. In addition, the heating unit 660 may be installed in the heating fluid supply pipe 692. The heating unit 660 according to an embodiment may be the heater described above. The heating unit 660 heats the fluid passing through the heating fluid supply pipe 692. The fluid heated by the heating unit 660 is supplied to the liquid supply pipe 674, and the heated fluid is supplied together with the liquid toward the bottom surface of the substrate W. The heated fluid may heat the liquid, raising its temperature.

Referring to FIG. 24, two outlets may be formed at a top end of the first nozzle 672. The liquid supply pipe 674 may be connected to one of the two outlets, and the heating fluid supply pipe 692 may be connected to the other of the two outlets. That is, according to an embodiment, the liquid and the heated fluid may be combined within the nozzle 672 to be supplied in unison toward the bottom surface of the substrate W, and/or the liquid and the heated fluid may be independently supplied (e.g., in sequence) to the bottom surface of the substrate W through the same nozzle 672.

According to an embodiment of the inventive concept described above, since there is no need to install the bypass pipe 655, a structural complexity of the substrate treating apparatus may be efficiently solved. In addition, since the relative humidity of the treating space can be adjusted along with the supply of liquid, a formation of foreign substances on the substrate W can be minimized with a simpler mechanism.

Therefore, it is possible to minimize the formation of foreign substances on the substrate W by a simpler mechanism.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a housing having an inner space;
a first support disposed in the inner space below a center region of a substrate and configured to contact a bottom surface of the substrate;
a treating container providing a treating space therein, the treating container being disposed in the inner space and surrounding the substrate supported on the first support;
a fluid supply unit provided below the substrate between the first support and the treating container to surround the first support and configured to supply a fluid toward the bottom surface of the substrate;
a first cleaning unit positioned below the substrate between the fluid supply unit and the treating container and configured to supply a liquid to the substrate supported on the first support; and
a heating unit configured to heat the fluid supplied by the fluid supply unit toward the bottom surface of the substrate to adjust a relative humidity of the treating space,
wherein an upper surface of the fluid supply unit is inclined in a direction toward an edge region of the substrate,
wherein the first support is further configured to support the center region of the substrate and to rotate the substrate,
wherein the fluid supply unit includes:
a body having a groove formed at a top surface and surrounding the first support, and
a main pipe connected to the groove to supply the fluid, and
wherein the heating unit includes a resistive beating element inserted into the groove to heat the fluid which passes through the groove.

2. The substrate treating apparatus of claim 1,
wherein the fluid supply unit includes a bypass pipe for bypassing the fluid past at least a portion of the main pipe, and
wherein the heating unit includes a heater installed at the bypass pipe to heat the fluid that flows through the bypass pipe.

3. The substrate treating apparatus of claim 1, further comprising:
a second support which supports the edge region of the substrate,
wherein the first support includes a spin chuck having a first vacuum adsorption hole to provide a vacuum adsorption connection to the substrate at the center region, and
wherein the second support includes:
a bracket which moves along a guide rail installed on a sidewall of the housing, and
a side chuck which is connected to the bracket having a second vacuum adsorption hole to provide a vacuum adsorption connection to the substrate at the edge region.

4. The substrate treating apparatus of claim 3, wherein the first cleaning unit comprises a nozzle configured to supply the liquid in an upward direction to the bottom surface of the substrate.

5. The substrate treating apparatus of claim 3,
wherein the first cleaning unit is configured to supply the liquid to the center region of the substrate when the substrate is supported on the second support but not supported by the first support, and
wherein the substrate treating apparatus further comprises a second cleaning unit configured to supply the liquid to the edge region of the substrate supported on the first support but not supported by the second support.

6. The substrate treating apparatus of claim 5, wherein the second cleaning unit is configured to supply the liquid to the bottom surface of the substrate while the first support rotates the substrate.

7. The substrate treating apparatus of claim 5, wherein the first cleaning unit is configured to supply the liquid to the bottom surface of the substrate while the substrate is horizontally moved by the bracket.

8. The substrate treating apparatus of claim 5, wherein the first cleaning unit includes:
a first nozzle positioned at an outer side of the spin chuck and to discharge the liquid to the bottom surface of the substrate, and
wherein the first nozzle projects upwardly and is inclined in a direction toward the edge region.

9. The substrate treating apparatus of claim 1,
wherein the first cleaning unit includes a nozzle configured to discharge the liquid to the bottom surface of the substrate, and
wherein the heating unit is in fluid communication with the nozzle to supply the heated fluid to the nozzle with the liquid so that the nozzle supplies the heated fluid and the liquid together to the bottom surface of the substrate.

10. The substrate treating apparatus of claim 1,
wherein the first cleaning unit includes a nozzle to discharge the liquid to the bottom surface of the substrate,
wherein the nozzle includes a plurality of outlets, wherein at least a first outlet of the plurality of outlets discharges the liquid and at least a second outlet of the plurality of outlets discharges the fluid, and
wherein the heating unit heats the fluid which is supplied to the second outlet.

11. The substrate treating apparatus of claim 1, wherein the heating unit is configured to heat the fluid to a temperature of 23° C. or higher.

12. The substrate treating apparatus of claim 1,
wherein the liquid includes at least one of a deionized water, water diffused with ozone, water diffused with hydrogen, and/or water diffused with ammonia, and
wherein the fluid is a gas.

13. A substrate treating apparatus comprising:
a housing having an inner space;

a first support disposed in the inner space below a center region of a substrate;
a treating container providing a treating space therein, the treating container being disposed in the inner space and surrounding the substrate supported on the first support;
a fluid supply unit provided below the substrate to surround the first support and configured to supply a fluid toward a bottom surface of the substrate;
a first cleaning unit provided below the substrate between the fluid supply unit and the treating container and configured to supply a liquid to the bottom surface of the substrate supported on the first support; and
a heating unit connected to the fluid supply unit and configured to heat the fluid supplied to the bottom surface of the substrate to adjust a relative humidity of the treating space,
wherein the fluid supply unit includes a main pipe and a bypass pipe for bypassing the fluid past at least a portion of the main pipe,
wherein the heating unit includes a heater installed at the bypass pipe to heat the fluid that flows through the bypass pipe, and
wherein an upper surface of the fluid supply unit is inclined in a direction toward an edge region of the substrate
wherein the first support is configured to support the center region of the substrate and to rotate the substrate,
wherein the fluid supply unit includes a body having a groove formed at a top surface and surrounding the first support,
wherein the main pipe is connected to the groove to supply the fluid, and
wherein the heating unit includes a resistive heating element inserted into the groove to beat the fluid which passes through the groove.

14. The substrate treating apparatus of claim 13,
wherein the first cleaning unit supplies the heated fluid and the liquid together to the bottom surface of the substrate.

15. The substrate treating apparatus of claim 13,
wherein the first cleaning unit further includes a nozzle configured to discharge the liquid to the bottom surface of the substrate,
wherein the nozzle includes a plurality of outlets, wherein at least a first outlet of the plurality of outlets discharges the liquid and at least a second outlet of the plurality of outlets discharges the fluid, and
wherein the heating unit heats the fluid which is supplied to the second outlet.

* * * * *